(12) United States Patent
Li et al.

(10) Patent No.: US 9,759,797 B2
(45) Date of Patent: Sep. 12, 2017

(54) MOTION SENSITIZED AND MOTION SUPPRESSED IMAGING USING DANTE PREPARED PULSE TRAINS

(71) Applicant: Isis Innovation Ltd., Oxford (GB)

(72) Inventors: Linqing Li, Oxford (GB); Peter Jezzard, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 1159 days.

(21) Appl. No.: 13/815,755

(22) Filed: Mar. 14, 2013

(65) Prior Publication Data

US 2013/0314086 A1 Nov. 28, 2013

Related U.S. Application Data

(60) Provisional application No. 61/685,616, filed on Mar. 20, 2012.

(51) Int. Cl.
| | |
|---|---|
| *G01V 3/00* | (2006.01) |
| *G01R 33/565* | (2006.01) |
| *G01R 33/561* | (2006.01) |
| *G01R 33/56* | (2006.01) |
| *G01R 33/483* | (2006.01) |
| *G01R 33/563* | (2006.01) |

(52) U.S. Cl.
CPC ... *G01R 33/56509* (2013.01); *G01R 33/5607* (2013.01); *G01R 33/5613* (2013.01); *G01R 33/4835* (2013.01); *G01R 33/5635* (2013.01)

(58) Field of Classification Search
CPC .................................................. G01R 33/5613
USPC .................................................. 324/306, 309
See application file for complete search history.

(56) References Cited

U.S. PATENT DOCUMENTS

| | | | | |
|---|---|---|---|---|
| 8,076,934 | B2 * | 12/2011 | Herzka | G01R 33/5614 324/306 |
| 9,448,296 | B2 * | 9/2016 | Wang | G01R 33/56 |
| 2013/0257429 | A1 * | 10/2013 | Edelman | G01R 33/5635 324/309 |
| 2016/0266223 | A1 * | 9/2016 | Bi | A61B 5/02007 |

* cited by examiner

*Primary Examiner* — Louis Arana
(74) *Attorney, Agent, or Firm* — Thomas | Horstemeyer, LLP

(57) ABSTRACT

Systems and methods for motion sensitized and motion suppressed quantitative imaging of a subject are provided as a train of interlaced radio frequency (RF) and magnetic field gradient pulses. Non-selective Delay Alternating with Nutation for Tailored Excitation (DANTE) pulse trains may be used in combination with gradient pulses and short repetition times as motion-sensitive preparation modules. In one or more embodiments, the systems and methods may use a train of low flip angle radio frequency (RF) pulses in combination with a blipped field gradient pulse between each RF pulse, repeated regularly. While the longitudinal magnetization of static tissue is mostly preserved, moving spins are largely (or fully) suppressed since they fail to establish transverse steady state due to a spoiling effect caused by flow along the applied gradient. The present systems and methods can be incorporated into any existing imaging readout for applications in vessel wall imaging, angiography, high resolution structural MRI, and also functional MRI.

20 Claims, 26 Drawing Sheets
(11 of 26 Drawing Sheet(s) Filed in Color)

a. α, Φ=0°, 180° alternating
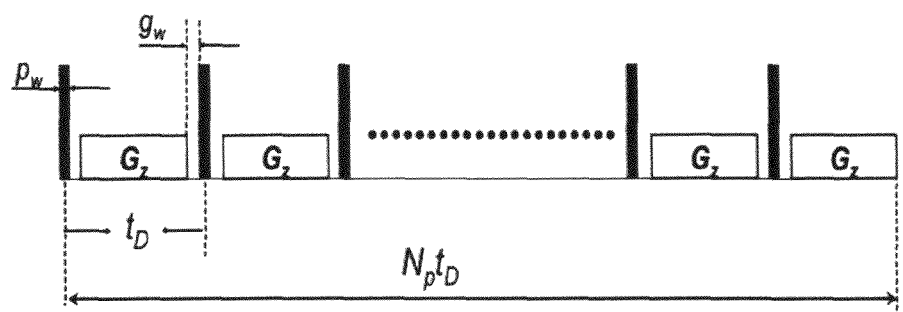
b.
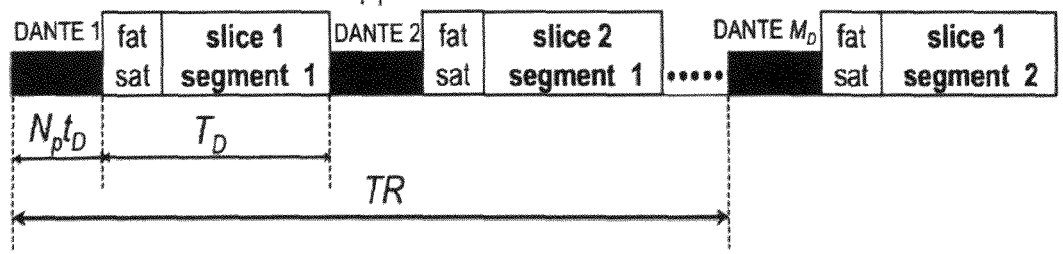
FIG. 2

MOTION SENSITIZED AND MOTION SUPPRESSED IMAGING USING DANTE PREPARED PULSE TRAINS

CROSS REFERENCE TO RELATED APPLICATIONS

This application claims priority to U.S. provisional application entitled "MOTION SENSITIZED AND MOTION SUPPRESSED IMAGING USING DANTE PREPARED PULSE TRAINS" having Ser. No. 61/685,616, filed Mar. 20, 2012, which is hereby incorporated by reference in its entirety.

INCORPORATION BY REFERENCE

Applicant incorporates by reference the following publications as if they were fully set forth herein expressly in their entireties:
1) Li L, Miller K L and Jezzard P, DANTE Prepared Pulse Trains: A novel approach to motion sensitized and motion suppressed quantitative magnetic resonance imaging. Magn Reson Med. 2012 68 (5) 1423-1438.
2) Each and every one of the rest of the publications listed in the References section appended hereto.

TECHNICAL FIELD

The present disclosure generally relates to medical imaging and, more particularly, relates to systems and methods for providing motion sensitized and motion suppressed imaging to help make diagnostic, prognostic or therapeutic decisions and for neuroscience research.

BACKGROUND

Delay Alternating with Nutation for Tailored Excitation (DANTE) pulse trains are a method used for frequency-selective excitation of a narrow frequency region in high-resolution NMR spectroscopy [1]. Another important application of DANTE pulse trains is in spatial tagging of magnetic resonance (MR) images [2] where a tagging gradient is played out concurrently with a series of low flip angle hard radio frequency (RF) pulses in order to saturate 1D bands or 2D grids of tissue signal, for example in the assessment of cardiac wall motion [3].

Motion sensitivity of steady-state free precession (SSFP) sequences has long been recognized and studied [4]. Although some applications relevant to flow suppression have been proposed [5-10] the importance of SSFP mechanisms for flowing-spin signal attenuation has not been fully realized. This is likely due to the fact that standard SSFP readout imaging sequences use selective RF pulses, for which the inflow signal enhancement of flowing spins is usually much stronger than any flowing spin signal attenuation effects. Another reason is the complexity in quantification of flowing spin attenuation, given the laminar pulsatile flow patterns typical in vivo, leading to a wide distribution of spin velocities in fluids such as blood and cerebral spinal fluid (CSF). However, flowing systems with velocities below 1 mm/s have been studied extensively by Patz et al., for which a flow de-phasing parameter has been introduced to quantify the signal attenuation in SSFP [11].

Several methods have been employed in the literature for effective flowing spin suppression, also known as black blood (BB) preparation, in order to assess vessel wall and spinal cord anatomy and pathology [12-17]. Among those methods, the Double Inversion Recovery (DIR) [15] and Motion Sensitive Driven Equilibrium (MSDE) [17] techniques are the two most prominent, chosen on the basis of the quality of their flow suppression effectiveness and their image acquisition efficiency. The DIR technique is known to have reasonable flowing spin suppression [18]. However, DIR imaging acquisition efficiency is generally compromised by its requirement for single-slice sequential acquisition, due to the use of non-selective 180° pulses [17] to define the $T_1$ null of the blood. In addition, the BB effect of DIR relies heavily on the balance between the flow velocities present and the thickness of the imaging slice. As such, it is very difficult to achieve high quality BB multi-slab 3D imaging with the DIR preparation due to the substantially increased outflow volume required for effective blood nulling compared to 2D imaging [18].

The MSDE module has been proposed as an alternative method to DIR with more robust flowing spin suppression qualities to address the difficulties of multi-slice 2D and multi-slab 3D image acquisition [17]. Sources of static signal loss are, however, inevitable, including inherent $T_2$ decay, $T_1$ steady state decay [19] and diffusion attenuation introduced by the MSDE preparation module. Some further sources of signal loss, such as eddy currents from the strong flow crushing gradients and imperfections in the MSDE module's 180° pulse(s) caused by $B_1$ inhomogeneities, can also be present. Moreover, specific absorption rate (SAR) problems due to the employment of multiple 90° and 180° pulses significantly compromise the use of multi-slice MSDE preparation at high static field [17].

In general, the biggest problem of these conventional techniques is that neither of them can be adapted as an ideal module for multi-interleaved slice acquisition.

Accordingly, there is a need to address the aforementioned deficiencies and inadequacies.

SUMMARY

In the present disclosure, we provide modified DANTE (Delay Alternating with Nutation for Tailored Excitation) pulse preparation systems and methods that provide a new magnetic resonance image (MRI) contrast between static spins and moving spins. The systems and methods are able to simultaneously suppress signal from moving spins while preserving static tissue signal (static spins) for MR imaging readout acquisitions. The moving spins can include flowing spins, such as flowing blood or cerebral spinal fluid (CSF) signal. The systems and methods show superior performance relative to standard methods that are used in MRI.

Briefly described are systems and methods for providing motion sensitized and motion suppressed quantitative imaging. In various aspects a system and method is provided that uses non-selective Delay Alternating with Nutation for Tailored Excitation (DANTE) pulse trains in combination with gradient pulses as motion-sensitive preparation modules, manipulating both the static and moving spins, and differentiating them via their different steady state signal behaviors. The static and moving spins may be manipulated optimally and/or simultaneously.

In any one or more embodiments, the systems and methods may use a train of radio frequency (RF) pulses in combination with gradient pulses regularly interleaved between RF pulses, the train repeated regularly, to drive static tissue into a steady state, for example a longitudinal and transverse steady state. The RF pulses may be, for example, low flip angle RF pulses, and the gradient pulses may be blipped field gradient pulses. While the magnetization of static tissue is mostly preserved, moving spins may be largely (or fully) suppressed since they fail to establish steady state due to a spoiling effect along the applied gradient. The suppression of moving spins is effectively insensitive to spin velocity (above a low threshold) and may be quantified with a simple $T_1$ magnetization decay model.

In any one or more embodiments, the present systems and methods provide a contrast mechanism for black blood (BB) vessel or CSF suppressed imaging that provides excellent flowing fluid, such as blood and CSF, signal suppression and static tissue signal preservation. While longitudinal magnetization of static tissue is mostly preserved, flowing spins may be largely (or fully) suppressed since they fail to establish transverse steady state due to a spoiling effect caused by flow along the applied gradient. The suppression of flowing spins may be quantified with a simple $T_1$ longitudinal magnetization delay model.

In any one or more embodiments, systems and methods are disclosed herein for providing motion sensitized and/or motion suppressed quantitative magnetic resonance imaging to help diagnostic, prognostic or therapeutic decisions and/or for use in neuroscience research comprising:

A. Providing a magnetic resonance imaging device;
B. Using the magnetic resonance imaging device in association with a subject to generate a train of radio frequency (RF) pulses in combination with field gradient pulses interlaced in between the RF pulses;
C. Repeating the train of pulses to drive static tissue in the subject into steady state in order to preserve the magnetization of the static tissue while suppressing moving spins in moving tissue or fluid in the subject; and
D. Acquiring an image of the static tissue signal having a suppressed signal from the moving tissue and/or fluids.

In various aspects the train of radio frequency pulses may include low flip angle radio frequency pulses, for example having a flip angle of about 45° or below, and typically considerably below. The field gradient pulses may be, for example, blipped field gradient pulses interlaced in a regular pattern between the RF pulses. For example, the field gradient pulses may be interlaced between each RF pulse, between every other RF pulse, or in any other regular pattern. The train of pulses including RF pulses with field gradient pulses interlaced in between the RF pulses may be regularly repeated. The field gradient for the field gradient pulses, for example, may provide enough gradient area to suppress signal from moving spins. In exemplary embodiments the RF pulses may have a non-selective flip angle of about 45° or less. In one or more embodiments, by substantially preserving static tissue signal while substantially suppressing signal from moving tissue or fluids, a contrast is created in the magnetization between the steady state of static spins and the non-steady state of moving spins in the acquired image. The image may be output to a user for diagnosis, prognosis, a therapeutic decision or for use in research, or for example displayed on a monitor or other display device or printed.

Other systems, methods, features, and advantages of the present disclosure for providing motion sensitized and motion suppressed qualitative or quantitative imaging will be or will become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2a and b depict an exemplary a) DANTE preparation module of the present disclosure with non-selective flip angle α (generally 1°-90°, preferably 3°-30°), either with constant 0° phase or with alternating 0° and 180° phase or other such regular pattern, and with the number of pulses in this individual DANTE train varying from 1 to an arbitrarily large number and b) multi-slice or multi-slab interleaved imaging acquisition with the DANTE preparation module applied before each of the imaging readout segments.

FIG. 4a shows the simulated $M_z$ time course of isolated spins with velocities of 0, 0.1, 0.5, 1.0, 5.0 and 10 cm/s. FIGS. 4b and 4c show the simulated $M_z$ values over a range of velocities, at different points in time. FIGS. 4d and 4e show the predicted $M_z$ values for a simulated blood vessel velocity distribution surrounded by static tissue.

FIGS. 5a-d depict four different DANTA pulse train flip angles (FA) of 0°, 4°, 6° and 8°, respectively.

FIGS. 9a-9d depict numerically simulated attenuation of static tissue signal based on Bloch equation simulations versus calculation via Eqn. 15.

FIG. 11a is the Bloch equation simulation of different decay patterns of static tissue and moving blood when the DANTE module of the present disclosure is employed for multi-slice interleaved acquisition. FIG. 11b shows measured signal (X) versus calculated signal in static tissue.

FIG. 13a shows the slice taken from position '1' in FIG. 13b. FIG. 13b is the slice taken from position '2' in FIG. 13a. FIG. 13c is the slice taken from the position '3' in FIG. 13a. FIG. 13d is the sagittal view of spinal cord and shows the detailed spinal nerves, which are invisible when using conventional MR spinal cord structure imaging techniques, such as MEDIC, due to hyper-intense CSF signal.

FIG. 18a shows the longitudinal signal of static tissue with different DANTE α. FIG. 18b depicts extracted static tissue from the Bloch equations implemented in the embodiment of FIG. 17.

DETAILED DESCRIPTION

Figure 1:
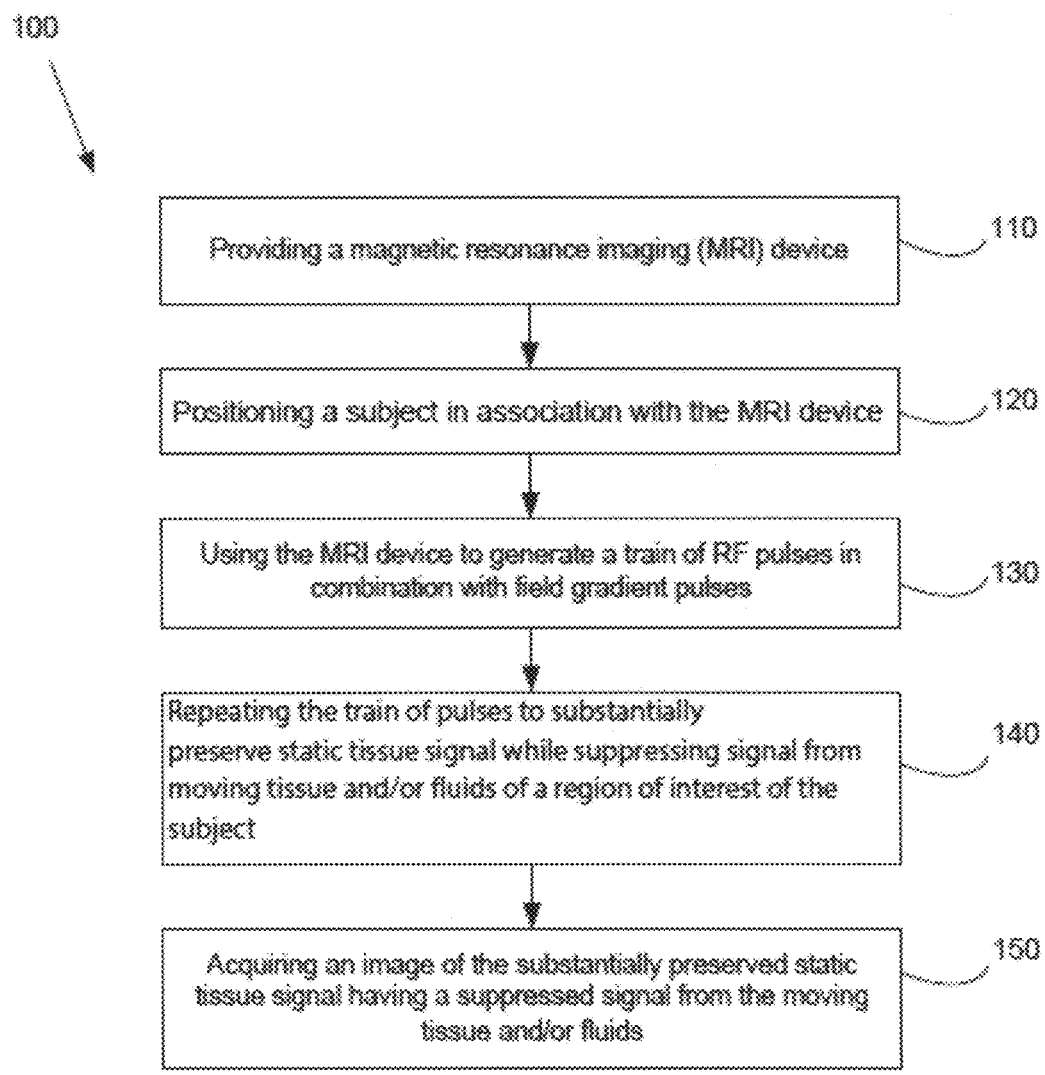
FIG. 1 depicts a flow chart for one embodiment for providing motion sensitized and motion suppressed imaging of the present disclosure.

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Described in detail below are systems and methods providing motion sensitized and/or motion suppressed quantitative imaging. In an embodiment a novel application of DANTE pulse trains is provided to the suppression of signal from moving spins, whilst largely preserving the signal from static spins. For example, the magnetization of static tissue along the longitudinal direction, therefore, loses very little signal, with the majority of the longitudinal magnetization being preserved for use in acquisition of the image. Moving spins (e.g., blood and CSF), however, given the same conditions, lack the ability to establish a transverse steady state due to phase dispersion accrued while flowing along the applied gradient. The longitudinal magnetization of spins of flowing fluids (flowing spins), such as blood and CSF, is thus largely or even fully suppressed. The present technique therefore creates a contrast in longitudinal magnetization between the steady state of static spins (static tissue) and the non-steady state (or progressive saturation) of the flowing spins. The present systems and methods, however, are not limited to the suppression of flowing spins, but may be applied to the suppression of any moving spins (spins of moving fluids or tissue).

The DANTE-prepared imaging sequence described herein can be considered as a non-selective unbalanced steady-state free precession (SSFP) module. One reason that the term DANTE is adopted rather than the term SSFP is that SSFP conventionally refers to the imaging readout sequence, whereas our present disclosure uses DANTE as a moving spin suppression preparation. However, another reason is that in order to describe a quantitative framework for the signal from moving and static spins it is the transient state magnetization that is more important than the steady state description.

As depicted in the flow chart of FIG. 1, one embodiment of the present systems and methods 100 includes providing a magnetic resonance imaging (MRI) device 110 and positioning a subject in association with the MRI device 120. In various aspects the subject may be any animal having tissue and moving fluids. For example, the subject may be a mammalian subject, in particular a human. The MRI device is then used to generate a train of radio frequency (RF) pulses in combination with field gradient pulses 130. For example, DANTE pulse trains may be applied in combination with a field gradient, achieving a significant suppression of moving spins. The DANTE pulse trains may include inter-pulse repeat times. Short inter-pulse repeat times (for example, $t_D$<5 ms) may be used. In one or more aspects the degree of field gradient applied may provide enough gradient area to suppress moving spins in the region of interest of the patient.

The train of pulses may be regularly repeated to substantially preserve static tissue signal while suppressing signal from moving tissue and/or fluids in a region of interest of the subject 140. The results may be quantified, for example, with a transient-state magnetization decay model derived via the Bloch equations. The static tissue, conversely, preserves the majority of its coherence despite the gradient fields applied during the DANTE pulse trains, providing minimal suppression of static spins and substantial suppression of moving spins relative to the static spins. In the case of flowing spins (flowing fluids) the field gradient may be applied along the direction of flow.

One or more images of the substantially preserved static tissue signal having a suppressed signal from the moving tissue and/or fluids are acquired 150. The one or more images may be used to make diagnostic, prognostic or therapeutic decisions in patients and for use in neuroscience research. Provided below is an exemplary effective analytical framework for quantifying the static and moving spin signals. This framework is validated using both Bloch equation simulation and experimental comparison.

Theory

A non-limiting embodiment of a DANTE prepared imaging sequence of the present disclosure is shown in FIGS. 2a and 2b, indicating both the DANTE preparation module itself, as well as an exemplary method for embedding it within an imaging readout method, such as a TSE sequence. $N_p$ is the number RF pulses. $T_D$ in FIG. 2b represents the inter-DANTE module delay time between successive α pulses, which can be either equal to or longer than the time required for the respective segment of the readout module, depending on the imaging TR and the number of segments measured in each TR. For example the time interval between α pulses may be below 5 ms, during which a gradient can be applied along the direction of flow in the case of flowing spins ($p_w$=60ρs and $g_w$=50 μs are selected in this exemplary diagram). Proper treatment of this duration in a theoretical model of image contrast may be important for rigorous quantification of the signal from moving and static spins.

FIG. 2a shows a train of $N_p$ low flip angle non-selective DANTE RF pulses of flip angle α (for example, generally 3°-15°), interspersed with gradient pulses of amplitude $G_z$. In the embodiment depicted, the preparation module may be either with constant 0° phase or with alternating 0° and 180° phase $N_p$ is the number of RF pulses. $N_p \times t_D$ is the duration of the DANTE module. $N_p$ represents the number of pulses applied in the present DANTE module. In an exemplary embodiment $N_p$ can be 10 to 100 pulses. $t_D$ is the time period of a pulse. In an exemplary embodiment $t_D$ can run ¾ ms to 2 ms. $T_D$ is the time interval between the end of one DANTE module and the start of the next (i.e., the inter-DANTE module delay time), which for example can constitute the fat saturation and readout durations. Imaging readouts are taken during the $T_D$ time intervals. In an embodiment $T_D$ is deliberately set to a large value so that longitudinal magnetization largely recovers before a subsequent DANTE module is applied. TR is the repetition time of each complete slice or slab. MD is the number of DANTE modules applied during the interleaved slice TR period.

During the DANTE module, static and moving spins may differ in terms of their phase coherence. For magnetization to exhibit phase coherence, the angle between the excitation pulse and the transverse magnetization phase must be fixed from one TR to the next (i.e., zero or linearly increasing phase). Quadratic or higher order phase accumulation will result in magnetization spoiling [20]. The first condition for phase coherence, then, is a fixed increment on the phase of the excitation pulse (common special cases are those of 0° increment: +α, +α, +α . . . and 180° increment: +α, -α, +α . . . ). In one or more aspects, we prefer that the phase accumulated by the transverse magnetization is the same in each pulse interval. Static spins can meet this condition if the gradient area during each $t_D$ is fixed (as in FIG. 2a). However, consider a spin moving with constant velocity v along the applied gradient. The location of the spin at time t is given by $X(t)=X_0+vt$ and the phase accumulation of the flowing spins between the $(n-1)^{th}$ and $n^{th}$ pulse is described by [20]:

$$\Delta\phi(n) = \gamma \int_{(n-1)t_D}^{nt_D} G(t')X(t')dt' = \quad \text{[Eqn. 1]}$$

$$\gamma\left(X_0 + \frac{1}{2}v\right)Gt_D + n\gamma vGt_D^2 = \theta_0(v) + n\theta_1(v)$$

where $\Delta\phi(n)$ is the phase accumulated between pulses at times $(n-1)t_D$ and $nt_D$, γ is the gyromagnetic ratio, and the simplifying assumption is made that the gradient is constant between the pulses.

This phase can then be broken into a constant phase increment ($\phi_0$) and a time-varying, increasing increment ($n\phi_1$). Static spins (v=0) will have a fixed phase increment, leading to overall linear phase accrual and are therefore phase coherent [21]. Moving spins, conversely, have an increment that increases with time (n), resulting in overall quadratic phase. This will result in a spoiling mechanism very similar to the commonly used quadratic phase cycling strategy used in RF spoiling [20]. Spoiling due to quadratic phase cycling has been well studied and is known to have a strong dependence on the specific phase increment ($n\phi_1$), with some values of $\phi_1$ having little effect on the magnetization (for example, $\phi_1$=360°). This suggests that the degree of spoiling would be dependent on the velocity of movement. In the case of flowing spins, for example, the degree of spoiling would be dependent on flow velocity.

As will be shown, however, even a small amount of velocity averaging (due to heterogeneity within a voxel) can result in efficient spoiling that is remarkably independent of mean velocity. The present DANTE preparation module shown in FIG. 2a with a short pulse interval can have a significant signal suppression effect on moving spins, in particular flowing spins. As shown herein, when DANTE pulse trains shown as FIG. 2a are applied, signal from moving spins is suppressed in a manner largely independent of the moving spin velocity. We find, for example, that the longitudinal magnetization decay of moving spins is dominated by simple progressive saturation as the transverse coherence of the spins is substantially spoiled by motion-induced phase dispersion. The static tissue, conversely, preserves the majority of its transverse coherence despite the gradient fields applied during the DANTE pulse trains. This leads to minimal suppression of static spins and substantial suppression of moving spins.

There are several differences between the sequence in FIGS. 2a and 2b and known magnetization dynamics. First, we provide a description for both static and moving magnetization. In addition, our DANTE trains constitute transient (non-steady-state) magnetization starting from an arbitrary initial magnetization. To account for these specifics, we begin with Carr's general framework for the magnetization using a matrix formalism [22]. We show how this approach can be used to derive closed-form expressions for the full transient magnetization. Finally, we present useful approximations that assume the transverse magnetization is fully spoiled in the case of moving spins.

Non-Moving Magnetization: Exact Formulation

Following Carr, the magnetization evolution for static spins at the end of the $n^{th}$ $t_D$ period can be described using matrices representing rotations (denoted R) and signal decay (denoted E):

$$M_n = R_z(\theta)E(T_1, T_2, t_D)R_x(\alpha)M_{n-1} + (1-E_1)M_0 \quad \text{[Eqn. 2]}$$

$$= AM_{n-1} + B$$

with $M_n = [M_{n,x} \; M_{n,y} \; M_{n,z}]^T$ and:

$$A = \quad \text{[Eqn. 3]}$$

$$\begin{bmatrix} \cos\theta & \sin\theta & 0 \\ -\sin\theta & \cos\theta & 0 \\ 0 & 0 & 1 \end{bmatrix} \begin{bmatrix} E_2 & 0 & 0 \\ 0 & E_2 & 0 \\ 0 & 0 & E_1 \end{bmatrix} \begin{bmatrix} 1 & 0 & 0 \\ 0 & \cos\alpha & \sin\alpha \\ 0 & -\sin\alpha & \cos\alpha \end{bmatrix}$$

$$B = (1-E_1)M_0$$

In Eqn 3 $E_1=\exp(-t_D/T_1)$, $E_2=\exp(-t_D/T_2)$, $\theta$ is the "generalized precession angle" per $t_D$ period, $\alpha$ is the DANTE flip angle, and $M_0=[0\ 0\ 1]^T$. The generalized precession angle, $\theta$, is the phase angel between the $n^{th}$ RF pulse and the magnetization immediately before this pulse. This conveniently captures both any fixed RF phase increment that may be employed, and off-resonance precession of the magnetization itself. For example, if the RF is applied with alternating phase ($+\alpha$, $-\alpha$, $+\alpha$ ...), and if the gradient G is on for approximately the entire $t_D$ period, and if the magnetization at position r has off-resonance frequency $\omega(r)$, then:

$$\theta=\pi+\gamma(Gr+\omega(r))t_D \qquad [\text{Eqn. 4}]$$

where $\pi$ is the RF phase increment and the middle term is Eqn 1 with $v=0$.

For a sufficiently long DANTE pulse train the magnetization reaches its steady-state ($M_{ss}$) when $M_n=M_{n-1}$. Thus, in this condition:

$$M_{ss}=AM_{ss}+B=(I-A)^{-1}B \qquad [\text{Eqn. 5}]$$

A matrix inversion can be used to calculate the well-known, closed-form expressions for the steady-state magnetization (see Eqns 6-12 in [23]).

For the purposes of this embodiment, however, we wish to describe the transient magnetization existing at the end of a shorter train of pulses applied to an arbitrary starting magnetization, $M_{ini}$, since this will describe the static tissue magnetization available to be sampled during each readout module. Starting from $M_{ini}$, we have at the end of the first DANTE $t_D$ period:

$$M_1=AM_{ini}+B \qquad [\text{Eqn. 6}]$$

and by successive application of Eqn 2 from this starting point, we can obtain:

$$M_n=A^n M_{ini}+(\Sigma_{k=0}^{n-1}A^k)B \qquad [\text{Eqn. 7}]$$

This closed-form expression exactly describes the transient magnetization at the end of the $n^{th}$ sub-period of the DANTE pulse train for an arbitrary starting magnetization $M_{ini}$. The first term in Eqn 7 describes how the initial magnetization decays with increasing n, while the second describes relaxation toward the steady-state of Eqn 5 (see Appendix 1 hereto).

It is worth noting that the gradient (and other field inhomogeneities) will induce a range of $\theta$ across the voxel. Because the magnetization at every voxel location behaves according to its local $\theta$, however, one can simply sum across vectors $M_n(\theta)$ to obtain the net voxel magnetization.

Moving Magnetization: Exact Formulation

In order to account for magnetization with velocity v, we must modify Eqn 2 to encapsulate an additional rotation about z that varies according to Eqn 1:

$$M_n=R_z(n\varnothing_1)AM_{n-1}+B=F^n AM_{n-1}B \qquad [\text{Eqn.8}]$$

where $\varnothing_1=\gamma Gvt_D^2$ is the motion-induced phase increment term described in Eqn 1, and $F^n=(R_z(\varnothing_1))^n$. (Note that $\varnothing_0$ in Eqn 1 is already accounted for in the static matrix A).

For an arbitrary initial starting magnetization, we can follow a similar (but more involved) derivation to that of static magnetization by propagating Eqn 2 through multiple sub-periods of the DANTE pulse train, starting from $M_{ini}$, to yield:

$$M_n=[\Pi_{k=1}^n(F^k A)]M_{ini}+\Sigma_{j=1}^{n-1}[\Pi_{k=j+1}^n F^k A]B+B \qquad [\text{Eqn. 9}]$$

where $\pi$ indicates a matrix product. Successive periods (increasing n) have increasing powers of the rotation matrix F. Because matrix products do not commute, Eqn 9 cannot generally be simplified as for the static magnetization in Eqn 7.

The central term in Eqn 9 is the product of rotated versions of the matrix A (i.e., each term Fk A represents A rotated by $k\phi_1$). For phase increments that are a small integer divisor of 360° (e.g., 90°, 180° or even 360°), the product of rotated A matrices will retain some phase coherence and will therefore leave the magnetization largely unspoiled. In particular, if $\phi_1$ is an integer multiple of 360°, F is the identity matrix, and Eqn 9 reduces to Eqn 7. For $\phi 1$ that do not form simple multiples of 360°, increasing powers of F will be incoherent and tend to cancel each other, resulting in a net operator that spoils the magnetization. Further, the range of velocities present in any physical vessel will tend to reduce the dependence of the degree of spoiling on the exact value of $\phi_1$, as shown later.

It is worth briefly commenting on the serendipitous nature of the signal suppression implied by Eqn 9. Most gradient-based methods for suppressing moving magnetization impart a phase profile with a linear dependence on velocity, which suppresses the signal provided the range of phases is close to some multiple of 360°. Here, the present DANTE pulse train is shown to naturally induce a different kind of velocity-based spoiling, in which even a small gradient causes moving spins to experience quadratic phase cycling from one $t_D$ period to the next. This property is remarkable in light of the fact that quadratic phase cycling has been shown to be the only phase manipulation that exactly satisfies the conditions for spoiling transverse magnetization [20] (although the degree of spoiling depends on the phase increment $\phi_1$, as discussed above).

Non-Moving Magnetization: Approximation

The above expressions are exact for the full magnetization, and in particular make no assumptions about spoiling. However, it is difficult to gain much intuition about the signal behaviour from equations in a matrix form. In this sub-section and the next, we present more intuitive approximations for the resultant longitudinal magnetization by assuming full or partial spoiling of the transverse components. Thus, we focus on the longitudinal component since it determines the contrast available to the subsequent imaging readout module.

For non-moving magnetization, phase coherence means that we cannot neglect the contribution of transverse magnetization to the longitudinal state. However, for small DANTE flip angles, as are used in an implementation of this sequence, we can assume that the transverse magnetization from two or more previous periods has a negligible contribution to the longitudinal magnetization. If we relate the $n^{th}$ period to the $(n-2)^{th}$ we note that:

$$M_n=A^2 M_{n-2}+(A+I)B \qquad [\text{Eqn. 10}]$$

and our approximation corresponds to zeroing the (3,1) and (3,2) elements of $A^2$:

$$\begin{bmatrix} \vdots \\ \vdots \\ M_{n,z} \end{bmatrix} = \begin{bmatrix} A^2(1,1) & A^2(1,2) & A^2(1,3) \\ A^2(2,1) & A^2(2,2) & A^2(2,3) \\ 0 & 0 & A^2(3,3) \end{bmatrix} \begin{bmatrix} \vdots \\ \vdots \\ M_{n-2,z} \end{bmatrix} + (A+I)B \qquad [\text{Eqn. 11}]$$

where [•] indicates quantities of no interest. Using the definitions of A and B in Eqn 3, we can then derive an expression for the longitudinal magnetization by calculating $A^2(3,3)$ and $(A+I)B$, giving:

$$M_{n,z} = E_{1,app}^2 M_{1-2,z} + (1+E_1 \cos\alpha)(1-E_1)M_0 \qquad \text{[Eqn. 12]}$$

where $E_{1,app}^2 = A^2(3,3)$ is an apparent $T_1$ decay over two periods:

$$E_{1,app} = \sqrt{E_1^2 \cos^2\alpha - E_1 E_2 \cos\theta \sin^2\alpha} \qquad \text{[Eqn. 13]}$$

For large n, this approaches a pseudo-steady-state ($M_{n,z} = M_{n-2,z}$) given by:

$$M_{pss,z} = \frac{(1+E_1\cos\alpha)(1-E_1)}{1-E_{1,app}^2} M_0 \qquad \text{[Eqn. 14]}$$

Combining Eqns 12 and 14, and assuming an initial magnetization $M_{ini,z}$ we finally obtain:

$$\begin{aligned}
M_{n,z} &= E_{1,app}^n M_{ini,z} + \left(\sum_{k=0}^{n/2} E_{1,app}^{2k}\right)(1-E_{1,app}^{2k})M_{pss,z} \\
&= E_{1,app}^n M_{ini,z} + \frac{1-E_{1,app}^n}{1-E_{1,app}^n}(1-E_{1,app}^n)M_{pss,z} \\
&= E_{1,app}^n(M_{ini,z} - M_{pss,z}) + M_{pss,z}
\end{aligned} \qquad \text{[Eqn. 15]}$$

As above, this expression represents magnetization transitioning from its initial state toward its steady-state at a rate dictated by $E_{1,app}$.

Note that the value of $E_{1,app}$, and hence the longitudinal magnetization that is achieved by the static spins, is dependent on the value of $\cos\theta$. Although in small part $\theta$ is modulated by the local field inhomogeneities, it is largely a function of the spatial offset of the spin in the gradient that is applied between the DANTE RF pulses, through Eqn 13. As such, $\cos\theta$ will be spatially varying, and will depend on the strength of gradient and the inter-pulse interval. In extreme cases it may give a sub-voxel modulation, but in general it will yield the banding pattern across the field-of-view that is a well-known property of balanced SSFP.

Figures 3A, 3B:
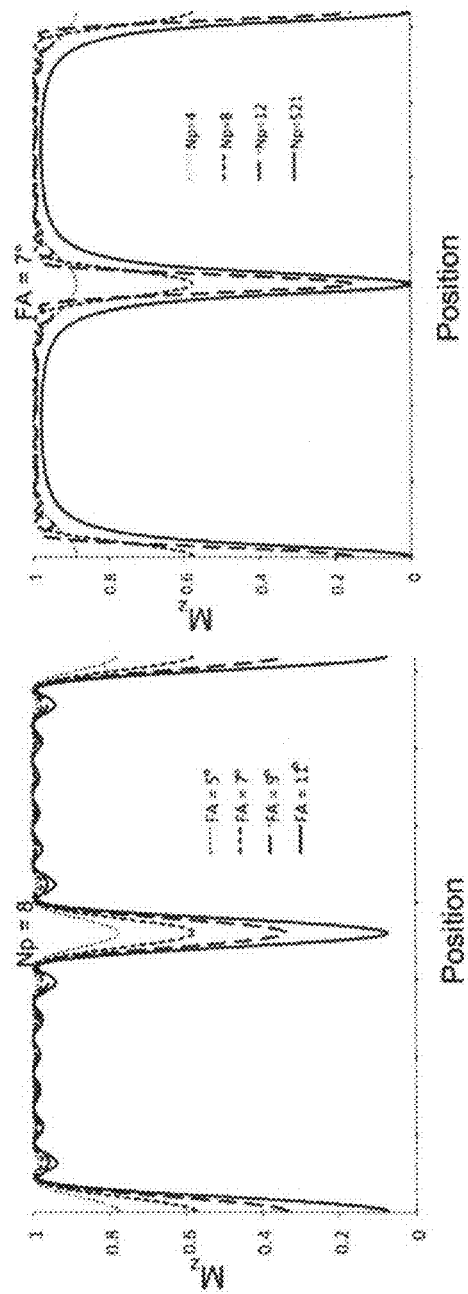
FIGS. 3a and 3b depict Bloch simulations showing the banding pattern with varying FA and $N_p$, respectively.

An example of the form of banding pattern, as a function of the gradient evolution term, $\theta$, is shown in FIGS. 3a and 3b. FIGS. 3a and 3b depict Bloch simulations showing the banding pattern with varying FA and $N_p$, respectively. Two banding periods are displayed. The left panel (FIG. 3a) shows the results of varying FA for a constant $N_p=8$. The right panel (FIG. 3b) shows the results of varying $N_p$ for a constant FA=7°. Relaxation times for the simulations were assumed to be $T_1=700$ ms and $T_2=70$ ms, respectively. A $t_D$ value of 1 ms was assumed.

It can be seen from FIGS. 3a and 3b that the form of the banding pattern depends on the flip angle (FA) and the total number of pulses ($n=N_p$) applied. It can also be seen that for the low flip angles used in the present DANTE pattern the width of the "troughs" is quite narrow, and for the typical RF pulse separations used in this study the bands will be separated by at least 500 Hz.

Moving Magnetization: Approximation

As discussed above, the case for moving magnetization is quite different. The phase of the transverse magnetization accumulates quadratically over time, which will spoil the transverse component for most values of $\phi_1$. Although some phase increments are not spoiled, we assume for now that the transverse magnetization is completely spoiled, such that $M_x = M_y = 0$. This should be valid since in any voxel within a vessel there will be a distribution of velocities, and hence phase increments, present. There is then no need to include the matrix F, since it only affects the transverse magnetization. Combining Eqns 2 and 3, we then obtain:

$$\begin{aligned}
M_{n,z} &= E_2 \sin\alpha(\sin\theta M_{n-1,x} + \cos\theta M_{n-1,y}) + \\
&\quad E_1 \cos\alpha M_{n-1,z} + (1-E_1)M_0 \\
&= E_1 \cos\alpha M_{n-1,z} + (1-E_1)M_0
\end{aligned} \qquad \text{[Eqn. 16]}$$

Starting from an initial z magnetization $M_{ini,z}$, and propagating through Eqn 16, we get a progressive saturation equation [24] given by:

$$\begin{aligned}
M_{n,z} &= (E_1 \cos\alpha)^n M_{ini,z} + \left(\sum_{k=0}^{n-1}(E_1\cos\alpha)^k\right)(1-E_1)M_0 \\
&= (E_1\cos\alpha)^n M_{ini,z} + \frac{1-(E_1\cos\alpha)^n}{1-E_1\cos\alpha}(1-E_1)M_0
\end{aligned} \qquad \text{[Eqn. 17]}$$

As $n \to \infty$, the magnetization will approach a steady state, given by:

$$M_{ss,z} = \frac{(1-E_1)}{1-E_1\cos\alpha} M_0 \qquad \text{[Eqn. 18]}$$

As for the non-moving spins, we can combine Eqns 17 and 18 to arrive at a very similar expression to Eqn 15 for moving magnetization:

$$\begin{aligned}
M_{n,z} &= (E_1\cos\alpha)^n M_{ini,z} + (1-(E_1\cos\alpha)^n)M_{ss,z} \\
&= E_{1,app}^n(M_{ini,z} - M_{ss,z}) + M_{ss,z} \\
E_{1,app} &= E_1\cos\alpha
\end{aligned} \qquad \text{[Eqn. 19]}$$

From Eqn 19, it can be seen that with increasing $N_p$ (i.e. maximum n for a given DANTE train) the magnitude of $M_{n,z}$ tends towards its steady state value, $M_{ss,z}$, with an apparent $T_1$ decay time given by $1/T_{1,app} = -\ln(\cos\alpha)/t_D + 1/T_1$.

When $\alpha$ is a small flip angle, a Taylor expansion may be used to write $\cos\alpha \approx 1 - \alpha^2/2$ and $\ln(1-\alpha^2/2) \approx -\alpha^2/2$, such that the apparent $T_1$ decay may be approximately expressed as $1/T_{1,app} \approx \alpha^2/(2t_D) + 1/T_1$. Thus we can see that employing a larger value of $\alpha$ is the most effective way to achieve a flow crushing effect because the $1/T_{1,app}$ rate increases with the square of $\alpha$.

Alternatively, given a fixed DANTE pulse train duration, $N_p \times t_D$, another method for effective motion crushing is to employ a smaller inter-pulse time, $t_D$, since this will also increase $1/T_{1,app}$. It is clear, however, that decreasing $t_D$ is not as effective as increasing $\alpha$ for crushing moving spins. It should be noted that increasing $\alpha$ will decrease the signal-to-noise ratio (SNR) of the static tissue simultaneously, the experimental observation of which will be detailed below. Note that Eqn 19 describes a velocity-independent suppression of the longitudinal magnetization. This is a direct result from our assumption of complete spoiling of the transverse magnetization, which is borne out by simulations presented below. This means that the present DANTE preparation module shown in FIGS. 2a and 2b is predicted to be largely velocity insensitive, which is of great advantage for flow crushing in cases of complex motion patterns.

Hence, for both the non-moving (static) and moving magnetization we have two formulations at our disposal. First, we have the exact descriptions of the full (transverse and longitudinal) transient magnetization with no assumptions about spoiling, given by Eqns 7 and 9. Second, we have the more intuitive approximations for the effective signal decay given by Eqns 15 and 19, obtained by assuming the transverse magnetization is partly or entirely spoiled.

Initial Magnetization

The final consideration for actual signal calculations is the effect of relaxation during the interval $T_D$ between DANTE pulse trains of the present disclosure. This determines the initial magnetization, $M_{ini,z}$, at the beginning of a given DANTE pulse train. For simplicity, we assume that the longitudinal magnetization is not disturbed by the readout. For the moving spins this will be approximately true, since the DANTE pulses are non-slice-selective, whereas the imaging readout pulses will act only on the slice or slices of interest. If the magnetization at the end of a DANTE train is denoted $M_{fin,z}$, then the longitudinal magnetization $M_{ini,z}$ immediately before the next DANTE train is given by:

$$M_{ini,z} = e^{-T_D/T_1} M_{fin,z} + (1 - e^{-T_D/T_1}) M_0 \qquad [\text{Eqn. 20}]$$

Eqn 20 can then be combined with the above expressions to fully describe the time evolution of the longitudinal magnetization.

Methods

In order to validate the above theory against experimental data we performed a number of numerical, phantom, and in vivo experiments, as follows:

Numerical Simulations

Bloch equation numerical simulations were performed in order to establish the velocity sensitivity of the present DANTE preparation, in light of the complicated motion patterns and wide spin velocity distribution found, for example, in blood vessels due to varying vessel sizes, laminar profiles, and pulsatile flow. Code was written using IDL (ITT, Boulder Colo., USA). Two situations were modeled. Firstly the response was modeled of spins with a specific velocity by explicitly solving the Bloch equations described in Eqns 7 and 9. These results were also integrated across a narrow range of velocities to study the effect of a small amount of velocity averaging. Secondly, a more realistic simulation was performed by modeling a super-sampled laminar flow profile of moving spins (with maximum velocity, $v_{max}$). Trapezoidal gradient pulses of amplitude $G_z$, played out between the component DANTE RF pulses, were assumed. In all simulations, the gradient direction was modeled as being applied along the direction parallel to motion or flow (e.g., z). Hard RF pulses were assumed to act on all spins, with the off-resonance evolution of each spin during and between the RF pulses being calculated via its position in the gradient field at each simulated time point t. For the moving spins $T_1$ and $T_2$ values of 1500 ms and 128 ms, respectively, were used, corresponding to values relevant to blood at 3 Tesla. For the static spins $T_1$ and $T_2$ values of 700 ms and 70 ms, respectively, were used. Following super-sampled simulation, net magnetization values were calculated by averaging the spin isochromats to a lower spatial resolution, in order to account for a realistic velocity distribution within vessel voxels. A variety of DANTE pulse train characteristics, motion velocities, and gradient amplitudes were assessed using this approach.

Figure 4:
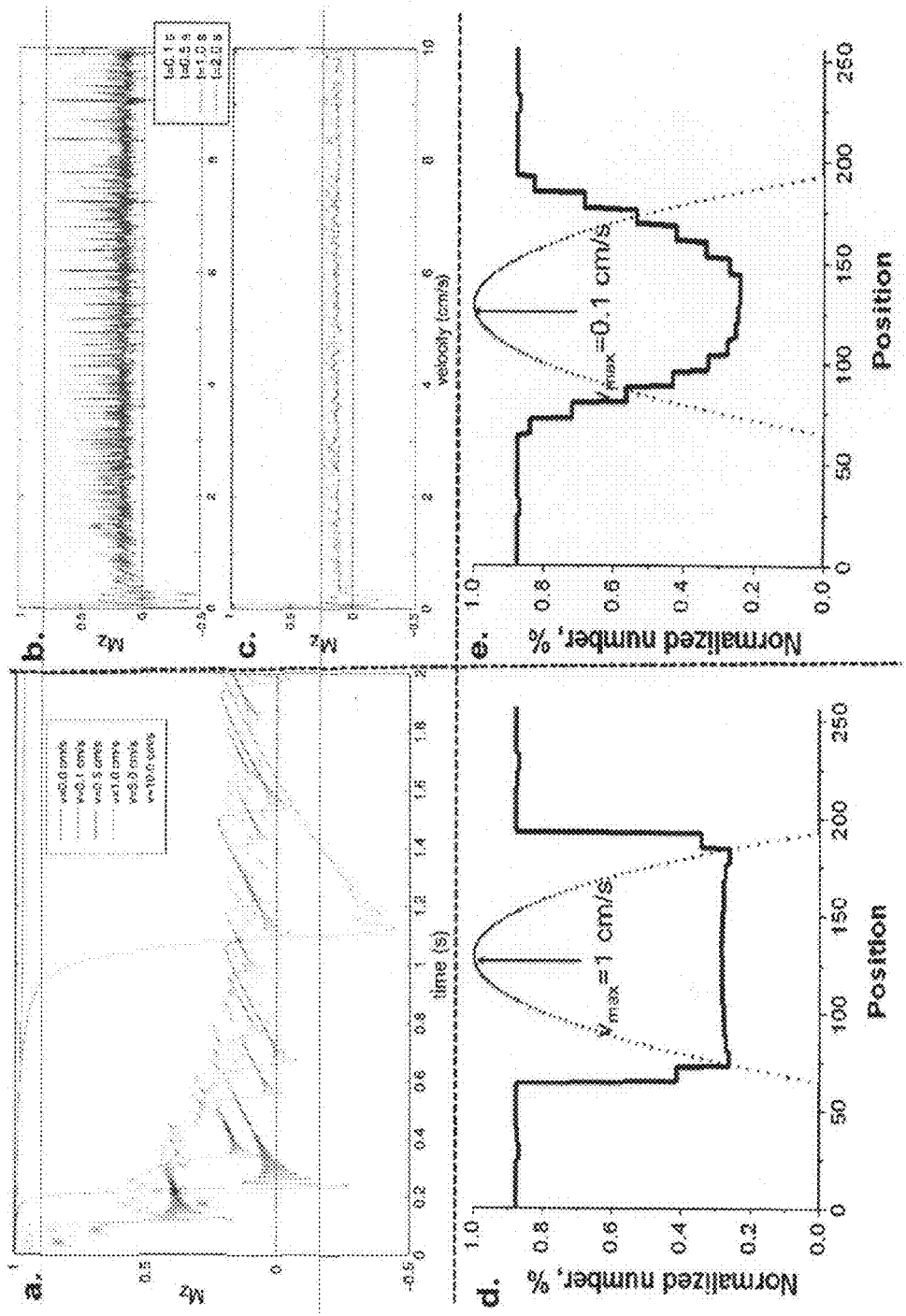
FIG. 4 depicts Bloch equation simulations showing $M_z$ of moving spins in the presence of repeating DANTE modules of the present disclosure.

FIG. 4 depicts Bloch equation simulations showing Mz of moving spins in the presence of repeating DANTE modules. FIG. 4a shows the simulated Mz time course of isolated spins with velocities of 0, 0.1, 0.5, 1.0, 5.0 and 10 cm/s. FIGS. 4b and c show the simulated Mz values over a range of velocities, at different points in time. In FIG. 4c the data are convolved with a kernel of width 0.1 cm/s to show the effects of magnetization cancellation over a distribution of velocities. FIGS. 4d and e show the predicted Mz values for a simulated blood vessel velocity distribution surrounded by static tissue. The overlaid parabolic curves represent a laminar flow velocity profile within the vessel with the maximum velocities vmax=1 cm/s and 0.1 cm/s.

Phantom Validation

To demonstrate the ability of the present DANTE module to preserve static spin signal and crush moving spin signal simultaneously, a flow phantom was constructed with 5 cm/s (average) tap water flowing through tubes attached to a standard phantom bottle, representing the shorter relaxation times of tissue. The relaxation time of the doped water in the standard phantom was about 100 ms for both $T_1$ and $T_2$. A tube containing static tap water (as marked on FIG. 5a, see below) was also attached representing long relaxation time tissue of about 2.5 s for $T_1$ and 700 ms for $T_2$. A standard turbo spin echo (TSE) sequence was chosen as the imaging readout sequence and a Siemens 3 T Verio scanner (Erlangen, Germany) was used for all experiments, along with a 12-channel head receive coil. Because the $T_1$ relaxation time of water is approximately 2.5 s at 3 T the TR of the TSE sequence was set to a rather large value of 2s to minimize the complication of successive DANTE modules interacting with one another. Details of the phantom imaging protocols used (Protocols 1 and 2) are shown in Table 1.

TABLE 1

Relevant protocols for phantom and in-vivo validation studies.

| Protocol No | Imaging slice acquisition | FA (α°) | $N_p$ | $t_D$ (ms) | $G_z$ (mT/m) | [&]Gradient duration (ms) |
|---|---|---|---|---|---|---|
| 1 | [a]TSE single slice | 0, 1, 2, 3, 4, 5, 6, 8, 10, 12 | 150 | 1 | 5 | ~1 |
| 2 | [a]TSE single slice | 0, 1, 2, 3, 4, 5, 6, 8, 10, 12 | 150, 300, 600 | 1 | 5 | ~1 |
| 3 | [a]TSE single slice | 5 | 0, 2, 200, 400, 800, 1600 | 1 | 5 | ~1 |
| 4 | [a]TSE single slice | 0, 1, 2, 3, 4, 5, 6, 8, 10 | 300, 150 | 1 | 5 | ~1 |
| 5 | [b]TSE 5 slice interleaved | 0, 1, 2, 3, 4, 5, 6, 7 | 164 | 1 | 5 | ~1 |

TABLE 1-continued

Relevant protocols for phantom and in-vivo validation studies.

| Protocol No | Imaging slice acquisition | FA (α°) | $N_p$ | $t_D$ (ms) | $G_z$ (mT/m) | [&]Gradient duration (ms) |
|---|---|---|---|---|---|---|
| 6 | [c]GRASE 3D interleaved | 15 | 72 | 2 | 6 | ~2 |
| 7 | [d]TSE 22 slice interleaved | 7 | 64 | 1 | 18 | ~1 |

[a]TSE single slice: 2D TSE with TR/TE = 2000 ms/13 ms; FOV = 150 × 150 mm; matrix size 256 × 252 interpolated to 512/512; echo train length = 7; receiver bandwidth = 130 Hz/pixel; slice thickness = 2 mm; number of signal averages = 1.
[b]TSE 5 slice interleaved: As for "TSE single slice" except that TR/TE = 1500 ms/13 ms.
[c]GRASE 3D interleaved: 3D GRASE readout with TR/TE = 1000 ms/15 ms; FOV = 150 × 150 mm; matrix size 256 × 252 × 8 for each slab interpolated to 512 × 512 × 8; turbo factor = 7; EPI factor = 3; receiver bandwidth = 514 Hz/pixel; slice thickness = 2 mm; 3 slabs interleaved; signal averages = 1.
[d]TSE 22 slice interleaved: As for "TSE single slice" but with 22 interleaved slices and no gap. TR = 2000 ms with 2 concatenations In Vivo Validation The same 3 T Siemens Verio scanner (Erlangen, Germany), fitted with a standard 4-channel neck coil, was employed to study seven healthy male volunteers under an approved technical development protocol (ages 24-35 years). Informed consent was obtained from all volunteers. In vivo studies were performed to validate the present DANTE pulse mechanism, consisting of: a) study of widely separated (long $T_D$) DANTE modules with a single slice 2D TSE sequence for readout in order to validate the response of the DANTE preparation to an increasing number of DANTE pulses (Protocol 3) and increasing flip angles (Protocol 4); b) study of closely separated DANTE modules with a multi-slice 2D TSE sequence for readout to validate the theory under conditions of short $T_D$ (Protocol 5); c) study of the banding artefacts for the case of closely separated DANTE modules with a 3D GRASE sequence (TR=1000 ms, Protocol 6) and 22 slice 2D TSE sequence (TR=2000 ms and two concatenations, Protocol 7) for readout, in order to assess some practical BB protocols. Details of the protocols used are shown in Table 1.

In the case of these latter experiments, in which multiple slices (Protocols 5 and 7) or multiple slabs (Protocol 6) were acquired during the TR period, a shorter time $T_D$ between DANTE pulse trains will pertain and the effect of preceding DANTE modules must be accounted for in the theory. For the TSE experiments conducted here a fixed TSE readout period of 120 ms duration was employed, i.e. the time $T_D$ for the TSE readout is assigned to 120 ms, including the time required for fat saturation. This duration allows a TSE echo train length of between 7 and 11, depending on the pixel bandwidth and SAR limitations of the protocol. The remainder of the TR time was filled with DANTE pulse preparations. In the case of Protocols 6 and 7 stronger gradient moments within the DANTE train were used in order to limit the banding effect for practically plausible protocols.

For all sequences an assessment of SNR and CNR was made. Following [17] we define the signal-to-noise ratio (SNR) of the resulting image as SNR=0.695×S/σ, where S is the signal intensity and σ is the standard deviation of the noise. The definition of contrast-to-noise ratio (CNR) is $CNR_{ml}=SNR_{muscle}-SNR_{lumen}$. The definition for $CNR_{eff}$ is then given by $CNR_{eff}=CNR_{ml}/(T_{SA})^{1/2}$ where $T_{SA}$ is the average scan time for each slice in units of minutes.

Quantitative Evaluation

We further conducted a quantitative evaluation of $T_1$ and $T_2$. Quantitative evaluation of $T_1$ and $T_2$ can be useful in clinical detection and classification of, for example, atherosclerotic plaques in large cranial and intra-cranial vessels as well as in the aorta. Because of the small size of arteries and the local field inhomogeneity, caused by the complex composition of plaque and susceptibility differences between blood and vessel wall, a fast and robust black blood (BB) imaging technique is desirable to deliver high resolution $T_1$ and $T_2$ maps on pixel-by-pixel basis. We previously demonstrated that during application of DANTE as preparation pulses for 2D turbo spin echo (TSE) imaging, the longitudinal magnetization of flowing spins is largely attenuated in contrast to static tissue, whose longitudinal magnetization is mostly preserved. (Li L, Miller K L and Jezzard P, DANTE Prepared Pulse Trains: A novel approach to motion sensitized and motion suppressed quantitative magnetic resonance imaging. Magn Reson Med. 2012 68 (5) 1423-1438, which is incorporated by reference as if fully set for herein expressly in its entirety).

In this evaluation, we first derived a highly simplified linear equation $M=M_0[1-\frac{1}{2}\alpha(T_1/T_2)^{1/2}]$ from the longitudinal Bloch equation at steady state case in the presence of DANTE pulses. This equation was then verified to be applicable in the case that the DANTE pulse train is interspersed with readout modules. Finally, preliminary in-vivo BB experiments for $T_1$ and $T_2$ mapping demonstrate that DANTE-TSE has the potential to be applied as a fast (3 measurements in 10 minutes with 39 slice coverage), high resolution (0.6×0.6×2 mm) and robust (insensitive to susceptibility in both preparation and readout module) imaging tool for relaxation time mapping of human carotid artery walls.

First the simplest case was considered where a single infinite long DANTE pulse train with gradient G, interspersed between RF pulses, is applied. The gradient G must be larger than $2\pi/\gamma t_D\Delta r$ to avoid banding artefacts (i.e. to render them subpixel or sub-slice thickness), as as below:

When $N_p$ is large number, $M_z$ reaches steady state $M_{zss}$ $$\text{When } N_p \text{ is large number,} \quad [\text{Eqn. 21}]$$
$$M_z \text{ reaches steady state } M_{zss}$$
$$G_z > \frac{2\pi}{\gamma t_D \Delta r}$$
$$M_z = \int_{-\pi}^{\pi} \frac{M_0(1-E_1)[E_2(E_2-\cos\theta)+(1-E_2\cos\theta)\cos\alpha]}{(1-E_1\cos\alpha)(1-E_2\cos\theta)-(E_1\cos\alpha)(E_2-\cos\theta)E_2} d\theta$$

-continued $$M_{zss} = M_0 \left(1 - \frac{\sqrt[\alpha]{\frac{1}{T_2}}}{\sqrt{\frac{4}{T_1} + \alpha^2\left(\frac{1}{T_2} - \frac{1}{T_1}\right)}}\right)$$

When $\alpha$ is small (0°-15°), or $1/T_2 - 1/T_1$ is small, $4/T_1 \gg (1/T_1 - 1/T_2)\alpha^2$ $$M_{zss} \cong M_0\left(1 - \frac{1}{2}\alpha\sqrt{T_1/T_2}\right)$$

where $\gamma$ is the gyromagnetic ratio, $t_D$ is duration between DANTE pulses, $\alpha$ the DANTE flip angle and $\Delta r$ the pixel size or the slice thickness. $M_{zss}$ is the longitudinal signal at steady state when the number of pulses, $N_p$, is a large number.

Under the condition $G > 2\pi/\gamma t_D \Delta r$ the equation's integral yields a closed-form expression for the longitudinal steady-state magnetization, i.e. a longitudinal Bloch equation[4]. Given DANTE parameters of small $\alpha$ (0-15°) and $t_D$ (typically 1-5 ms, much smaller than tissue $T_1$ and $T_2$), the integration of the equation can be solved and simplified into a linear equation $M_{zss} = M_0[1 - \frac{1}{2}\alpha(T_1/T_2)^{1/2}]$. The more practical case, where the DANTE pulse train is interspersed with readout modules, is considered in FIG. 1b. It was found that when $T_D$, the readout module duration (typically <100 ms), is small compared with the tissue $T_1$, the equation derived may be still valid.

The same Siemens 3 T Verio scanner along with a 4-channel neck coil was used for the evaluation experiments. A healthy volunteer (male, 28 years) underwent DANTE prepared TSE. Minimally, three measurements are required to yield both $T_1$ and $T_2$ maps. Measurements 1 and 2, implemented with DANTE $\alpha = 4°$ and $8°$, respectively, and a TSE echo time of 19 ms. These two measurements can generate a $T_1/T_2$ ratio map. Measurement 3 was undertaken with TE=60 ms and a DANTE $\alpha = 4°$. Pixel-based calculation of images from Measurements 1 and 3 yield a $T_2$ map. From these data a $T_1$ map can also be calculated. To verify the derived linear equation in-vivo, additional measurements were implemented with DANTE $\alpha = 0°$, $2°$, $6°$ along with a readout TSE TE=19 ms. For all images a matrix of 256×256×39 was used with FOV 150 mm, yielding 0.6×0.6×2 mm resolution. Each measurement took 3 minutes (turbo factor=7, bandwidth/Px=391 Hz, $T_D$=70 ms, DANTE $N_p$=32, $t_D$=1 ms, and a gradient $G_z$=18 mT/m, iPat=2, NEX=2). Our results are presented in the Results section below.

Additional In Vivo Application Methods To Demonstrate Extensions of the Method in Neuroscience Research:

1. CSF flow suppressed spinal cord functional MRI data were acquired using a multi-slice DANTE-EPI sequence run as a functional MRI (fMRI) experiment.

The performance of DANTE-EPI and conventional EPI methods was compared using resting state fMRI scans (300 ms and 2 s TR) and using a finger tapping motor task. Resting state data were evaluated using (i) a hand-drawn cord mask and signal variance maps, and (ii) power spectra of resting time series. Three healthy volunteers were trained to perform finger tapping at a frequency of approximately 1 Hz with either their right or left hand. A block design was used with seven 30 s rest and six 30 s active blocks. Three (at the $C_6$ level) or nine (covering $C_5$ to $C_8$) cervical axial slices were acquired using a 3 T Siemens Verio scanner (fitted with a 4 channel neck coil) using the following EPI readout parameters:

TE/TR=31/2000 ms, FA=90°, GRAPPA (factor=2), phase encoding (P→A), resolution 1.33×1.33 mm in-plane (96× 96), 4 mm slice thickness with 100% gap. Physiological data were acquired with a pulse oximeter and respiratory bellows. Each slice was motion corrected in 2D using FLIRT (part of FSL). Subsequently, data were spatially smoothed (3 mm FWHM), high-pass temporal filtered (90 s), and activity assessed using slice-specific physiological noise regressors within the general linear model (FEAT, part of FSL). Activity is reported for p<0.01 (uncorrected). In both experiments the EPI parameters were identical, except that for conventional EPI acquisitions, the DANTE flip angle (FA) is equal to zero.

2. Non-Contrast digital subtraction MR angiography using DANTE-GRE.

The application of the DANTE approach to non-contrast agent magnetic resonance angiography was tested using a DANTE-prepared flow-compensated gradient echo multi-slice sequence: 2D GRE with TR/TE=291 ms/7.4 ms; FOV=150×150 mm; matrix size 256×252 interpolated to 512/512; Segments=13; receiver bandwidth=260 Hz/pixel; slice thickness=2.5 mm; number of signal averages=1, interleaved slice number=72, flip angle=45, GRAPPA (factor=2). For the DANTE module, flip angle=10° (or 0° for non-flow-suppressed GRE), $t_D$=500 μs, $G_z$=18 mT/m. The DANTE-prepared acquisition was then subtracted from the non-DANTE prepared acquisition to yield an image showing only the blood lumen signal, since the static signal substantially subtracts to zero.

Results

Numerical Simulations

FIG. 4 shows numerical simulations of the magnetization (Mz) evolution, with FIGS. 4a-4c being stepwise Bloch equation simulations that were found to yield identical results to Eqn 7 and 9. FIG. 4a shows a simulation of the transient evolution of longitudinal magnetization from equilibrium for a series of spins with isolated velocities of 0, 0.1, 0.5, 1.0, 5.0 and 10.0 cm/s. The following DANTE parameters were assumed: flip angle 7°, number of pulses per DANTE train $N_p$=1000, RF pulse spacing 2 ms, gradient strength 6 mT/m. FIG. 4a demonstrates a distinct temporal signature for each velocity value. In particular, the time taken for the reduction in longitudinal magnetization is velocity dependent, with slower velocities maintaining high longitudinal magnetization further into the DANTE pulse train. This velocity dependence can be examined in more detail by plotting the longitudinal magnetization for a full range of simulated velocities, calculated from 0.0 to 10.0 cm/s in increments of 0.01 cm/s. The value of the longitudinal magnetization calculated at various times following the start of the DANTE pulse train is shown in FIG. 4b. It can be seen that the longitudinal magnetization is fairly unstable early in the DANTE train, but soon settles down to a low asymptotic value (here, of about $M_z$=0.14) across a large range of velocities. However, there is a noticeable "spikiness" to the magnetization profile as a function of velocity, with certain isolated velocities displaying fairly high levels of longitudinal magnetization. These velocities correspond to phase increments ($\phi_1$) that maintain some coherence throughout the DANTE pulse train.

Within a voxel, however, we do not expect perfect velocity homogeneity (nor, in fact, do we expect a given spin to experience perfectly constant velocity). If we simulate even a modest distribution of velocities by convolving the magnetization values by a simple kernel of 0.1 cm/s width, we observe the magnetization profile shown in FIG. 4c, which predicts a remarkably uniform attenuation of the longitudinal magnetization over a broad range of velocities above approx. 0.1 cm/s, and even for relatively short DANTE pulse trains. In FIG. 4c the data are convolved with a kernel of width 0.1 cm/s to show the effects of magnetization cancellation over a distribution of velocities.

FIGS. 4d and 4e show Bloch equation simulation results illustrating the effect of repeated DANTE pulse trains on spins moving within a simulated vessel having a laminar velocity profile and with different maximum velocities. The overlaid parabolic curves represent a laminar flow velocity profile within the vessel with the maximum velocities $v_{max}$=1 cm/s and 0.1 cm/s. The simulations assumed the same DANTE pulse train parameters as for FIGS. 4a and 4b. Results are shown for peak flow velocities of 1 cm/s and 0.1 cm/s. It can be seen that for peak moving spin velocities greater than 0.1 cm/s, the signal attenuation caused by the present DANTE module is approximately 80%, regardless of the maximum velocity assigned (other maximum velocity values above 0.1 cm/s showed this same attenuation). This suggests that the attenuation of signal from moving spins is relatively independent of flow velocity for values above 0.1 cm/s (1 mm/s).

Phantom Validation

Figure 5:
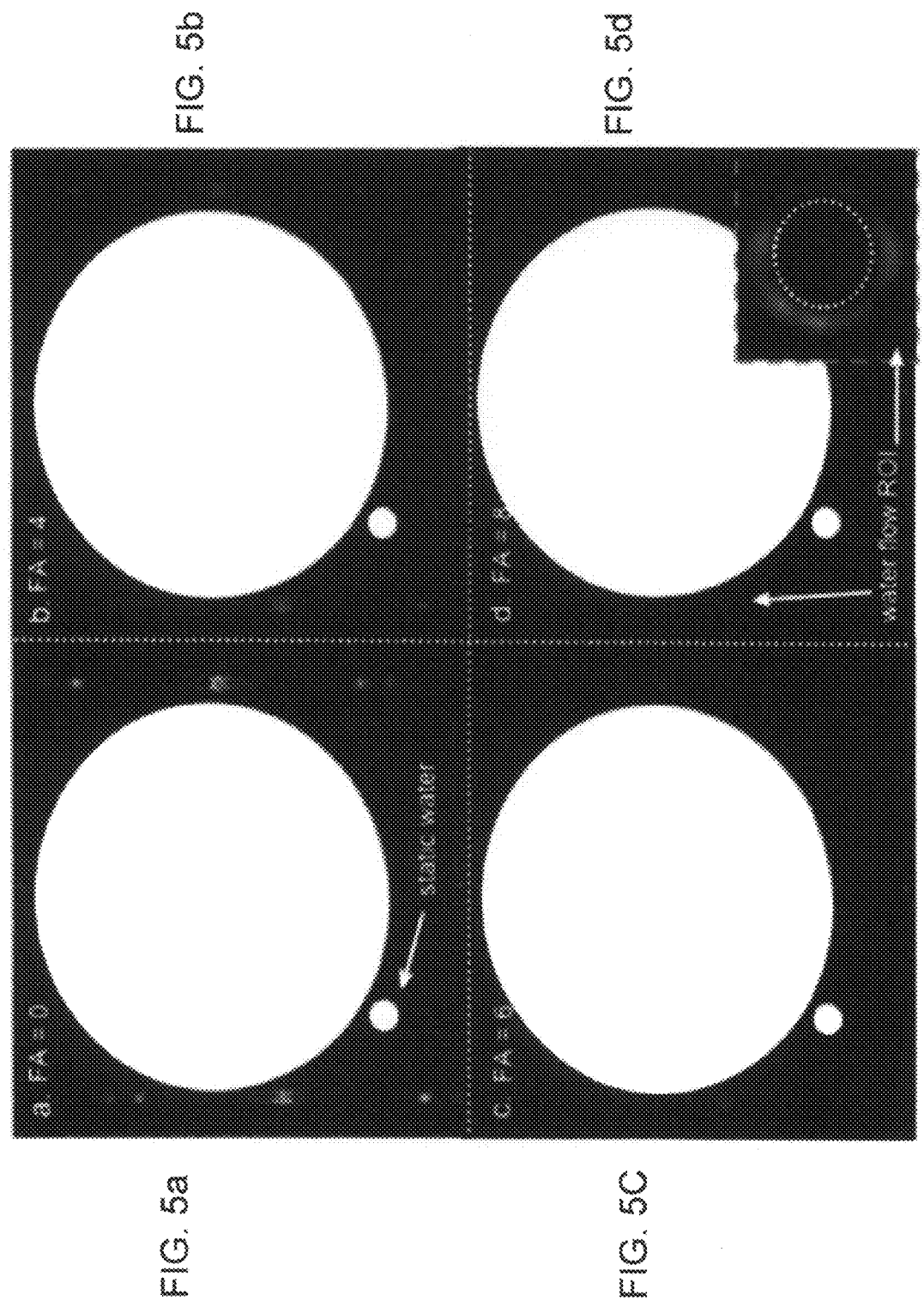
FIG. 5 depicts a phantom demonstration of the flowing-spin suppression properties of the DANTE module of the present disclosure.

FIG. 5 depicts Phantom demonstration of the flowing-spin suppression properties of the DANTE module. FIG. 5 shows imaging results acquired by setting the number of pulses ($N_p$) to 150 and the time interval between DANTE pulses ($t_D$) to 1 ms. A long TR of 2 s, and a single slice acquisition were used to achieve a long $T_D$ meaning that there is only one segment acquired per TR. Four of the different DANTE pulse train flip angles (FA) of 0°, 4°, 6° and 8° taken from Protocol 1 of Table 1 are shown, respectively, in FIGS. 5a-d. It is clear that at a DANTE pulse train flip angle of 6° (FIG. 5c) the artefact caused by motion (flow) is dramatically decreased. Wth a flip angle of 8° (FIG. 5d), under the same greyscale settings, the moving signal has disappeared without discernable signal change of the static water signal. To quantify the moving spin signal, the assumption was made that the residual water signal in the ROI area of FIG. 5 would allow a reasonable quantification of moving spin suppression between images acquired with different DANTE flip angles. The area inside the residual water circle in FIG. 5d was chosen as the flow region of interest (ROI), shown as the magnified image at the right corner of FIG. 5d. This ROI was applied to all images. Four representative images from Protocol 1 are displayed.

Figure 6:
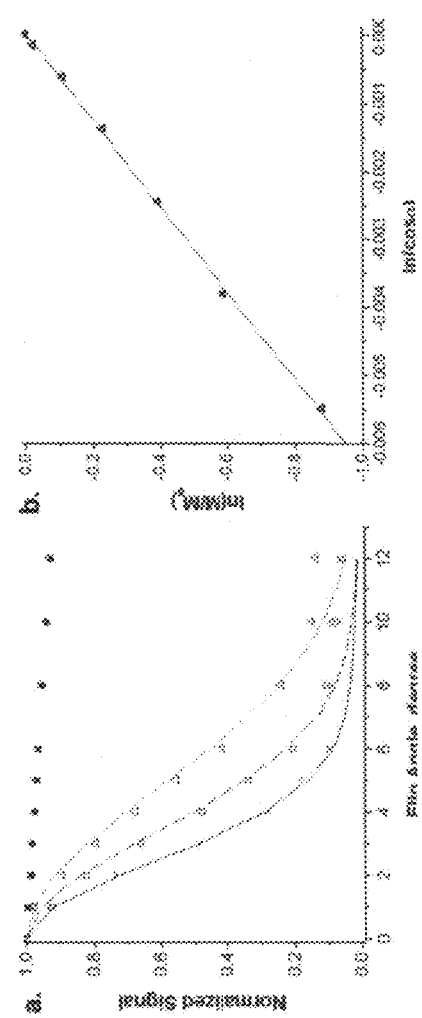
FIG. 6a depicts theoretical and experimental comparison of the DANTE preparation module of the present disclosure for flow crushing.
FIG. 6b depicts a demonstration of the linear equation $\ln(M/M_0)=N_p*\ln(\cos \alpha)$.

The quantified suppression of static and moving spin is displayed in FIG. 6. Additional values for the number of DANTE pulses within each train ($N_p$=150, 300, 600) were selected for these validation experiments (Protocol 2 of Table 1). Theoretical curves are overlaid on FIG. 6, calculated via Eqn 19 with $M_{ini,z}$=1 (initial full equilibrium magnetization). FIG. 6a depicts theoretical and experimental comparison of the present DANTE preparation module for motion (flow) crushing. Measured signal attenuation of moving spins for $N_p$=600, 300 and 150 are labeled as crosses, squares, and triangles, respectively. The theoretically calculated signal suppression of moving spins based on Eqn 19 for $N_p$=600, 300 and 150 are shown overlaid as solid line, dashed line and dotted line, respectively. The measured signal suppression of static spins for water and doped water are shown as filled square and open circle, respectively, which are significantly overlapped. The relevant parameters for image acquisition can be found in Protocol 2 of Table 1.

FIG. 6b depicts a demonstration of the linear equation $\ln(M/M_0)=N_p*\ln(\cos \alpha)$. The measured signal suppression of moving spins for $N_p$=150 is labeled as open triangles. The linear fit is shown overlaid as a solid line.

In Vivo Validation

Figure 7:
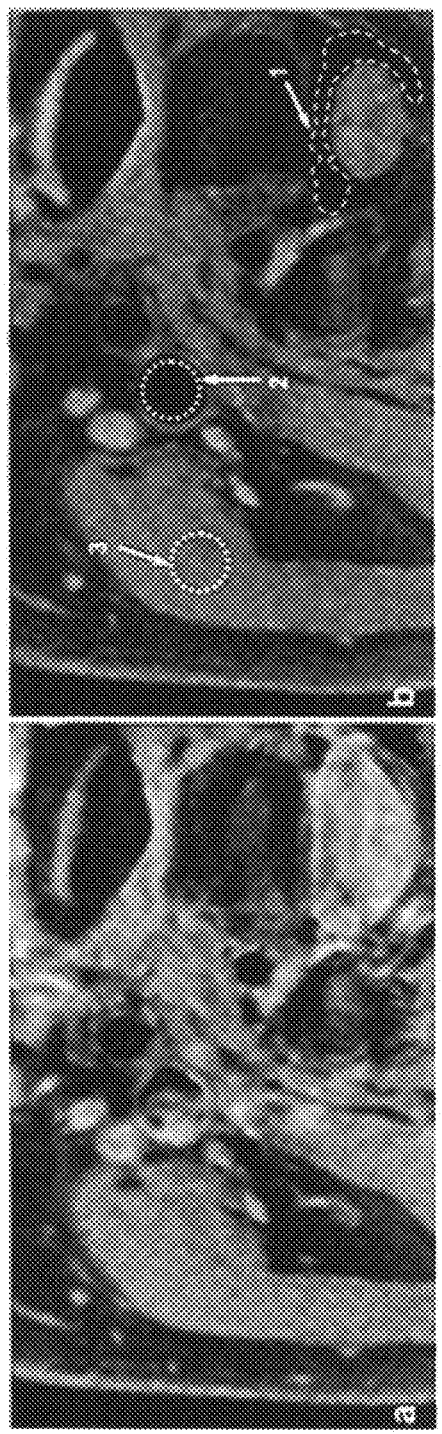
FIG. 7 depicts demonstration of flowing-spin suppression of the DANTE preparation modules of the present disclosure in vivo, $N_p=2$ and 1600 shown respectively in FIGS. 7a and 7b.

FIG. 7 presents a demonstration of flowing-spin suppression of DANTE preparation modules in vivo. The long TR used in the in-vivo validation experiments for Protocols 3 and 4 make the images acquired in FIG. 7 proton density weighted images. Six datasets were acquired with a different number of pulses in the DANTE pulse train (see Protocol 3 of Table 1) in order to test the fit between the theoretical model and experimental data. Five 2D TSE proton density weighted images were acquired axially in the neck with $N_p$=2, 20, 200, 400, 800, and 1600 RF pulses, respectively (only $N_p$=2 and 1600 are shown in panels in FIGS. 7a and 7b, respectively). ROIs 1, 2 and 3 shown in FIG. 6b indicate the regions selected for CSF, blood, and static tissue signal quantification. The relevant parameters for image acquisition can be found in Protocol 3 of Table 1. A DANTE flip angle of 5° was kept constant for all acquisitions. The determination of ROIs shown as '1' and '2' in FIG. 6 for CSF fluid and arterial blood, respectively, was based on the image acquired with $N_p$=1600 because its superior contrast-to-noise ratio offered the optimal discrimination between static tissues and residual signal of moving spins. ROI '3' was chosen in the (static) muscle signal.

Figure 8:
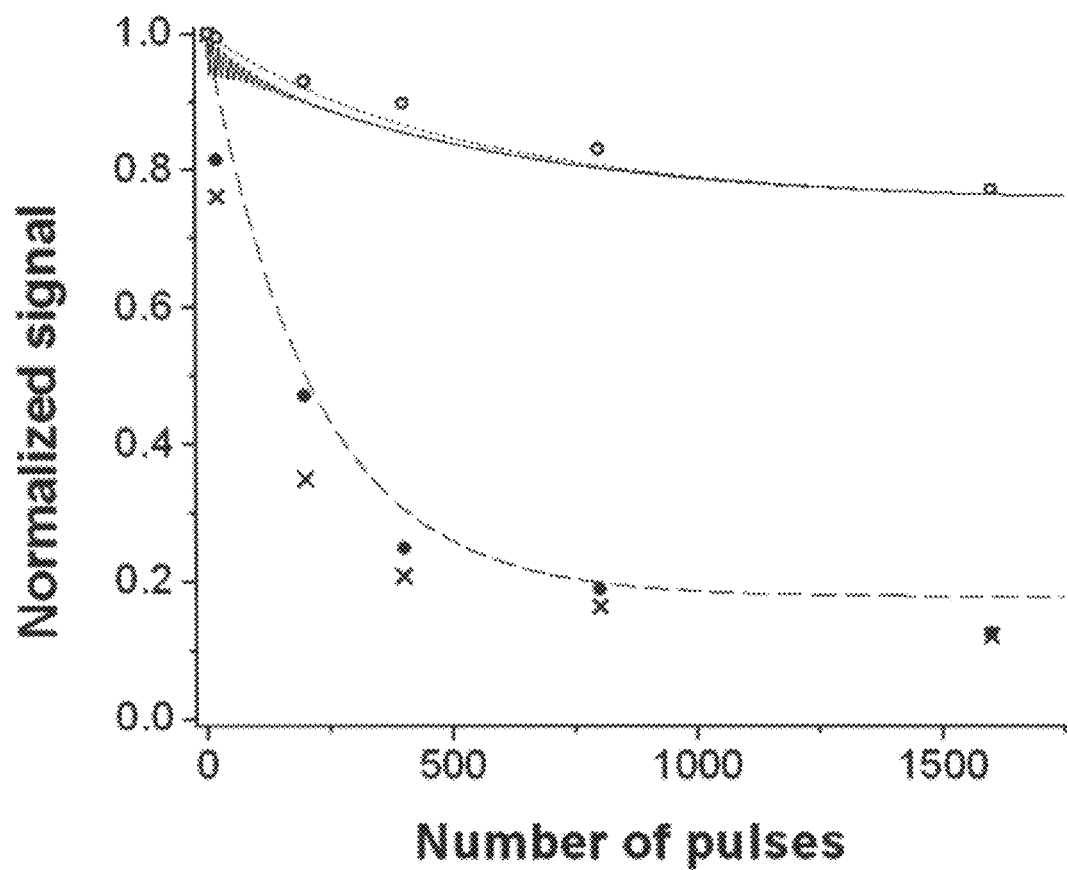
FIG. 8 depicts theoretical and experimental comparison of the DANTE preparation module for the data illustrated in FIG. 7.

The quantified signal suppression curves of blood and CSF with a varied number of DANTE pulses per train are shown in FIG. 8. FIG. 8 presents a theoretical and experimental comparison of the DANTE preparation module for the data illustrated in FIG. 7. Both can be described approximately by Eqn 19. Signal values were achieved by integrating the signal intensity within the ROIs shown in FIG. 6. The measured signal suppression of CSF, blood and static muscle tissue under different $N_p$ values are marked with x, filled circle, and open circle, respectively. The theoretically calculated signal suppression for CSF and blood, based on Eqn 19 for moving spins, is shown as a dashed line. The theoretically calculated signal suppression for muscle, based on Eqn 15 for static spins, is shown as a dotted line. Additionally, the simulated signal suppression of static signal based on a full numerical Bloch equation simulation is shown as a solid line. The parameters used for calculation and numerical simulation were $T_{1blood}$=1500 ms, $T_{1tissue}$=700 ms, $T_{2tissue}$=70 ms, DANTE flip angle=5°, $t_D$=1 ms.

Also shown in FIG. 8 is the fit between theory and experiment for the static tissue signal. For this the muscle signal contained in ROI '3' (from FIG. 7b) was used for comparison with theory. FIG. 8 shows that with a DANTE pulse train flip angle of 5° the muscle signal does not reach a steady state of about $M_{pss,z}$=76% until ~1.6 s, i.e. after about 1600 pulses in this case. The precession angle θ (see Theory section) is dependent on the spin position, gradient amplitude and local inhomogeneity. However, it is valid to use a calculated precession angle θ for theoretical fitting if images with different Np are acquired at the same z position. This effective precession angle was inserted into the Bloch equation simulation to yield the solid curve in FIG. 8, and into Eqns. 14 and 15 with $M_{ini}$=1 to yield the simple decay curve shown by the dotted line. Both curves agree with the measured signal intensity of muscle during this non-steady state period of the DANTE train evolution.

Figure 9:
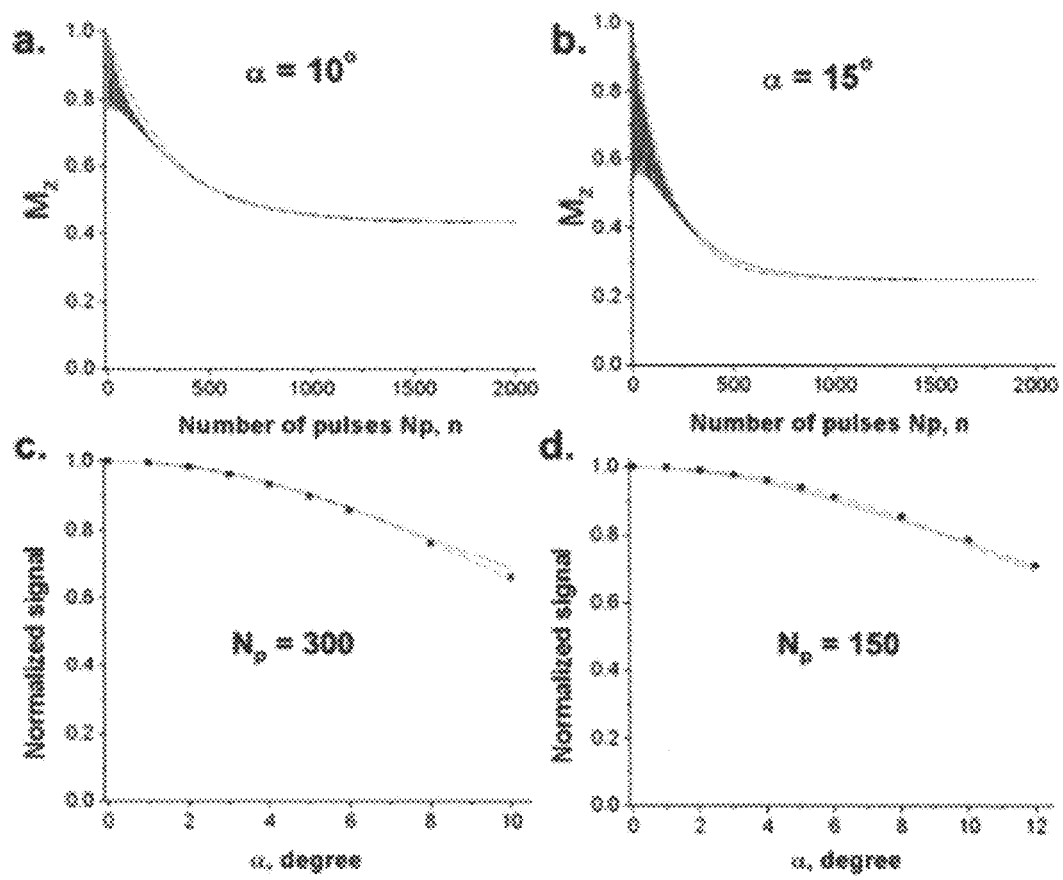
FIG. 9 depicts theoretical and experimental comparison between the calculations of Eqn 15, simulations of the Bloch equations, and in vivo human measurements for different flip angles under the same protocol as for FIG. 7.

Comparison results between theory and experiment for Protocol 4 of Table 1, in which the flip angle of the DANTE pulse train is varied under the same protocol as for FIG. 7, are shown in FIG. 9. Signal suppression was calculated by integrating the signal intensity within muscle ROIs (similar in location to the ROI shown in FIG. 7). In FIGS. 9a-9d, numerically simulated suppression of static tissue signal based on Bloch equation simulations versus calculation via Eqn 15 are shown as solid line and dashed line, respectively. The experimental signal intensity from muscle is shown as closed squares in FIGS. 9c and 9d. The relevant parameters for image acquisition can be found in Protocol 4 of Table 1.

FIGS. 9c and 9d show the in vivo muscle signal intensity decay (as solid squares) as a function of varying the DANTE train flip angle. FIG. 9c shows in vivo results for $N_p$=300 and FIG. 9d shows results for $N_p$=150. The simplified model (dashed line), as well as the full numerical simulation (solid line), both shown overlaid on FIGS. 9c and 9d, agree well with the measured signal decay. Also shown for comparison in FIGS. 9a and 9b are the simple approximated calculation and the full simulation of the predicted signal over a wide range of pulse train lengths for flip angles of 10° and 15°. These show that the approximated calculation follows the envelope of the full numerical simulation curve, confirming that Eqn 15 simplifies the complex evolution of the partially spoiled phase in the DANTE train and gives an approximate description of the non-steady state signal decay envelope.

Figure 10:
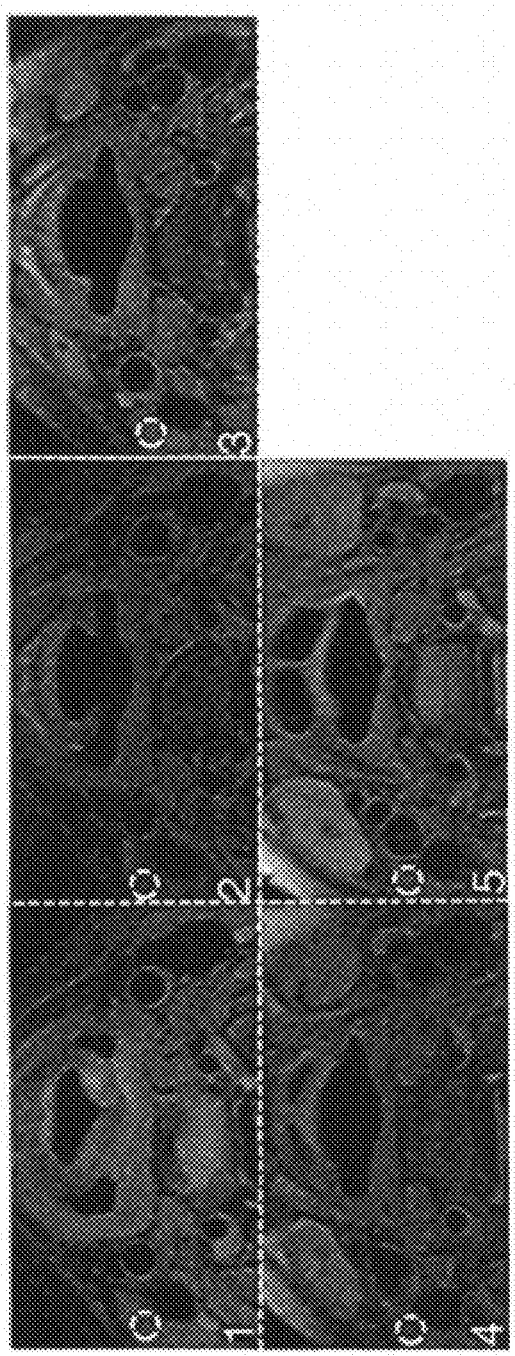
FIG. 10 depicts preliminary demonstration of a multi-slice interleaved black blood (BB) imaging acquisition, consisting of five images shown from the multi-slice acquisition.

Multi-slice images collected with a DANTE-BB pulse train with FA=5° and a 2D TSE readout (from Protocol 5 of Table 1) are shown in FIG. 10. Five images are shown from the multi-slice interleaved TSE protocol with BB preparation. The overall imaging acquisition time is 54 s. The relevant parameters for image acquisition can be found in Protocol 5 of Table 1. These images show an averaged SNR of muscle ($SNR_{muscle}$) in 5 slices of 13.3. The averaged SNR for carotid artery lumen ($SNR_{lumen}$) is 1.9. The contrast-to-noise ratio ($CNR_{ml}$) is therefore 11.4 and the $CNR_{eff}$ is 27 $min^{-1/2}$.

Figure 11:
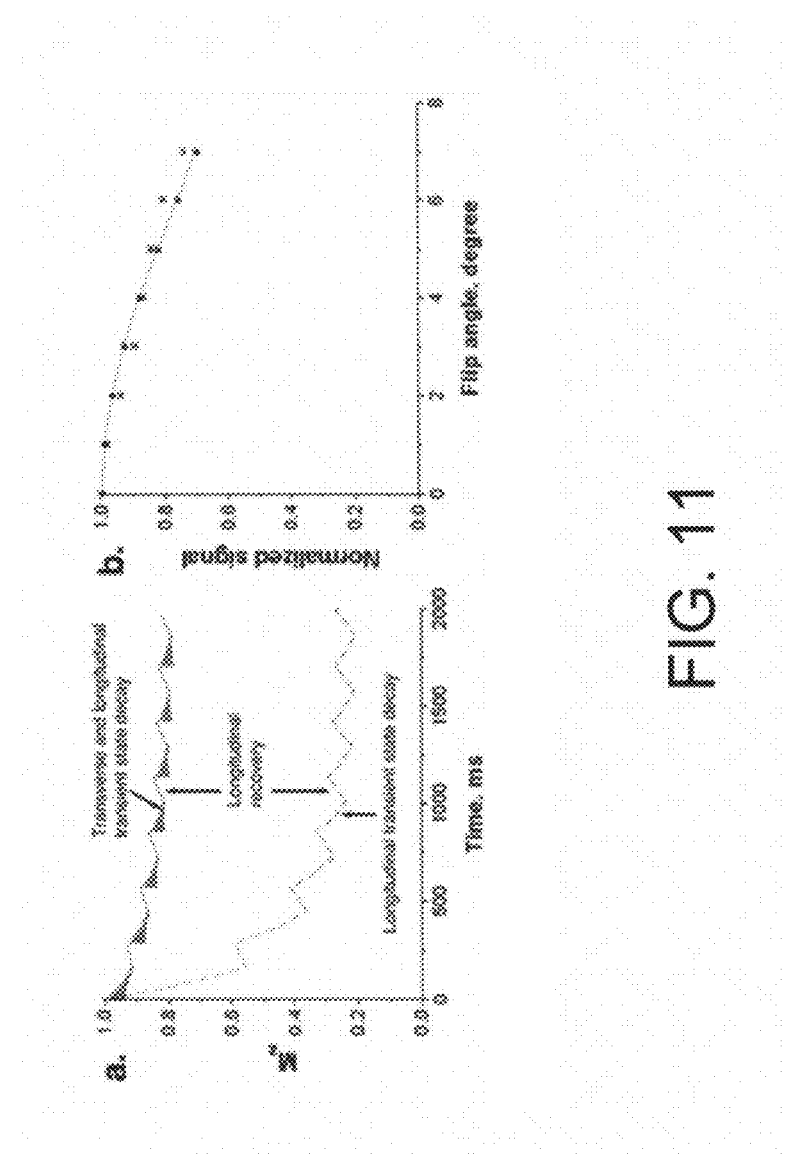
FIG. 11 depicts simulation and quantification of static tissue and moving blood signal for DANTE prepared multi-slice interleaved 2D TSE with short $T_D$.

FIG. 11 shows a comparison of theory and experiment for the multi-slice in vivo data. The experimental signal intensity values are taken from the averaged signal within the 5 ROIs shown in FIG. 10. The relevant parameters for signal decay simulation and image acquisition can be found in Protocol 5 of Table 1. FIG. 11a shows a theoretical Bloch equation simulation of different decay patterns of static tissue and moving blood when the present DANTE module is employed for multi-slice interleaved acquisition under conditions of short $T_D$ illustrating the establishment of the respective steady state for static spins (static tissue) and moving spins (moving blood) are shown as solid line and dashed line, respectively. FIG. 11b shows measured signal (x) versus calculated signal in static tissue. As illustrated in FIG. 11a, when repeated DANTE pulse trains with $N_p$=164 pulses are employed, the static tissue shows little signal loss as it approaches its steady state. Conversely, moving spins fail to establish transverse coherence leading to more significant longitudinal magnetization loss. During imaging readout both static tissue and moving spins exhibit partial recovery of longitudinal magnetization. In vivo data from the muscle ROI obtained with various flip angles ranging from 0° to 7° (Protocol 5, using the ROIs for signal intensity integration shown in FIG. 10) are shown in FIG. 11b. For comparison, the curve calculated from the combination of Eqn 15 and Eqn 20 is also shown on FIG. 11b with filled squares and agrees reasonably with the Experimental measurements.

Figure 12:
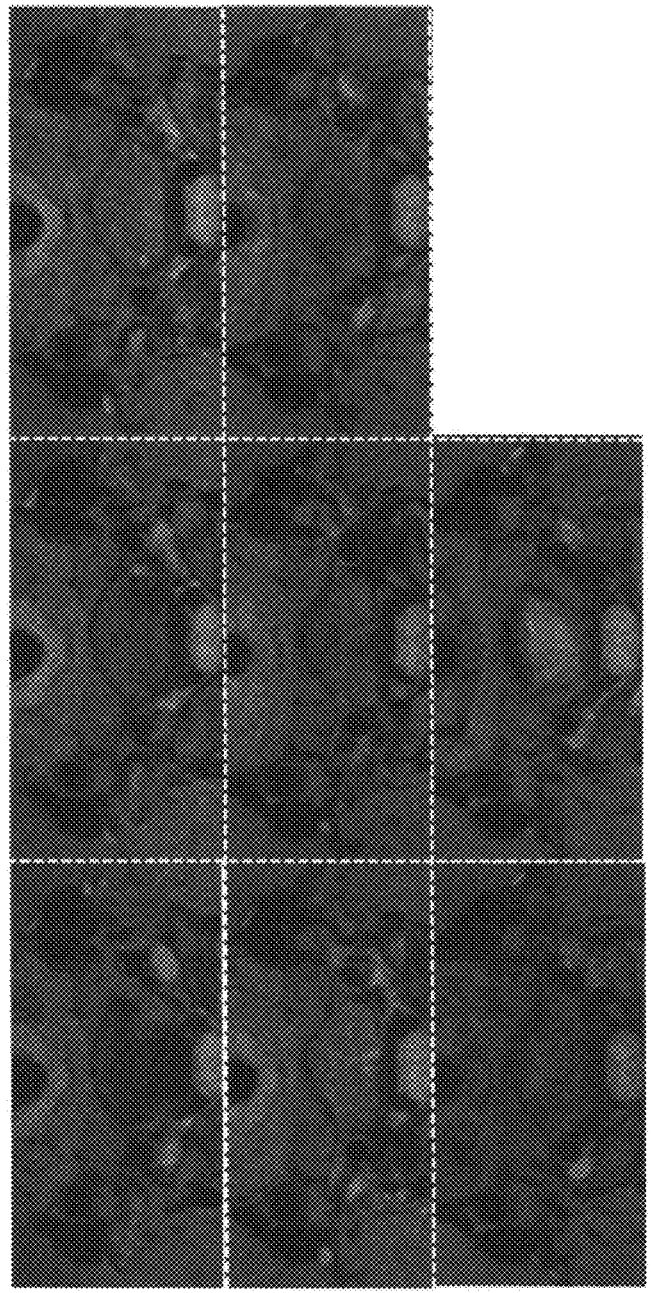
FIG. 12 depicts a preliminary demonstration of a multi-slab interleaved BB imaging acquisition without banding artefact.

For Protocol 6 of Table 1 three slabs with 8 slices in each slab were acquired with an interleaved 3D GRASE sequence with DANTE-BB preparation. The overall imaging acquisition time is 144 s. The imaging speed is 6 sec/slice. The relevant parameters for image acquisition can be found in Protocol 6 of Table 1. A longer $t_D$ value of 2 ms and a gradient amplitude of 6 mT/m were selected for the present DANTE preparation module, with a 15° flip angle. This results in a banding separation Δr equal to 1.9 mm, marginally less than the slice thickness in each slab. FIG. 12 depicts a preliminary demonstration of multi-slab interleaved BB imaging acquisition without banding artifact. Images are shown from a 3-slab interleaved 3D GRASE protocol with DANTE-BB preparation. Each slab consisted of 8 contiguous slices. Uniform muscle signal intensity in each slice indicates that the banding separation is low enough to avoid significant artefact. The SNR of muscle ($SNR_{muscle}$) for the full 24 slices was measured to be 14. The averaged SNR for the carotid artery lumen ($SNR_{lumen}$) was measured to be 2. Hence the contrast to noise ratio ($CNR_{ml}$) is 12. By using 3D GRASE, with its higher signal acquisition efficiency than 2D TSE, the averaged imaging speed is as high as 6 sec/slice. The calculated $CNR_{eff}$ is thus 38 $min^{-1/2}$, which is 30% higher than the 2D DANTE multi-slice experiments described above.

Figure 13:
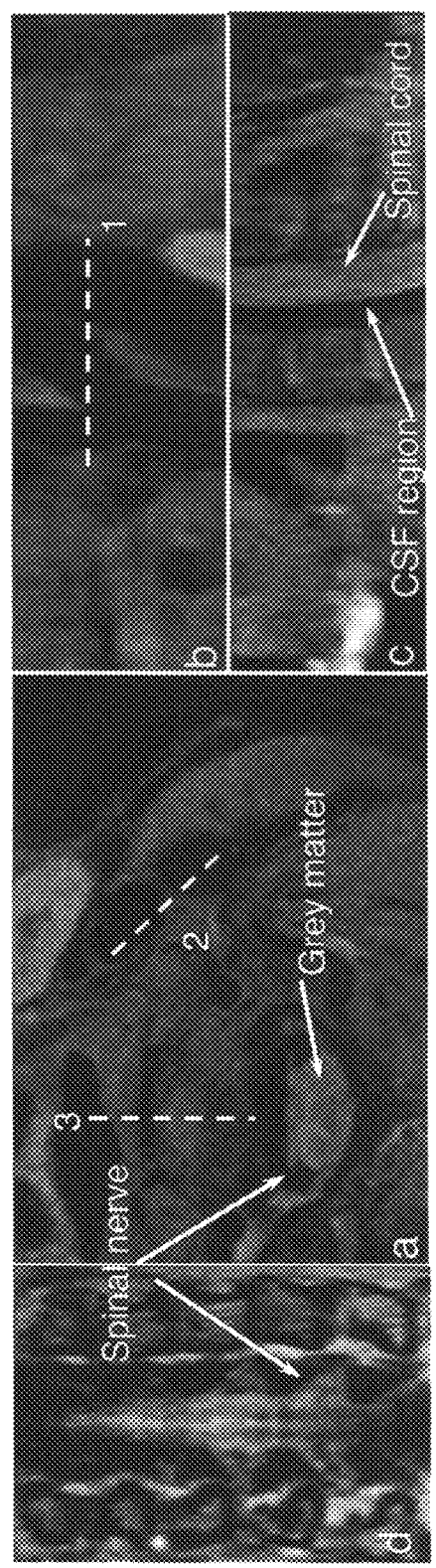
FIG. 13 depicts demonstration of banding artefact-free interleaved 2D multi-slice DANTE-BB imaging acquisition. Twenty-two contiguous slices were acquired.
Figure 14A:
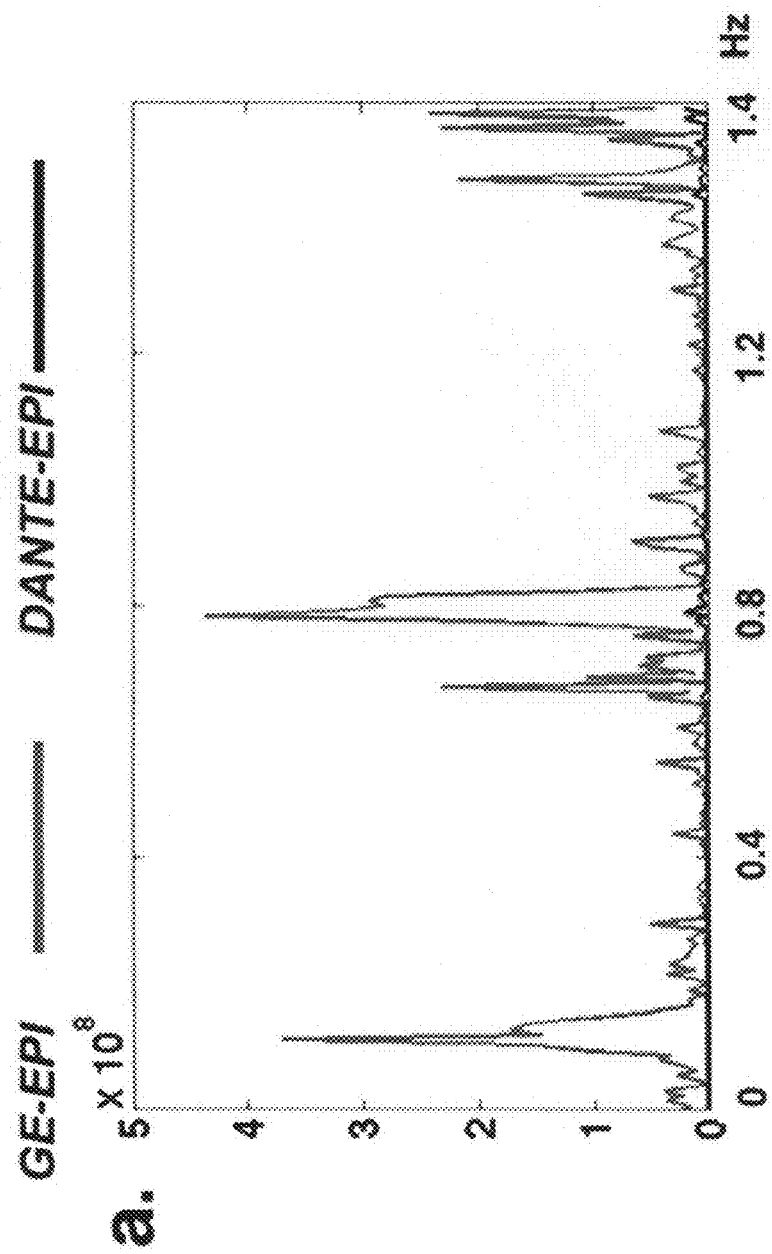
FIG. 14 depicts mean image signal and power spectrum comparisons of conventional gradient echo EPI (GE-EPI) (FIG. 14e) and DANTE-EPI data (FIG. 14F) (TR=300 ms, one subject as example). Four voxels (FIGS. 14a-d) extending from the CSF into the cord are selected showing significantly suppressed cardiac noise in CSF and at edge of the cord, whilst maintaining signal within the cord.
Figure 14B:
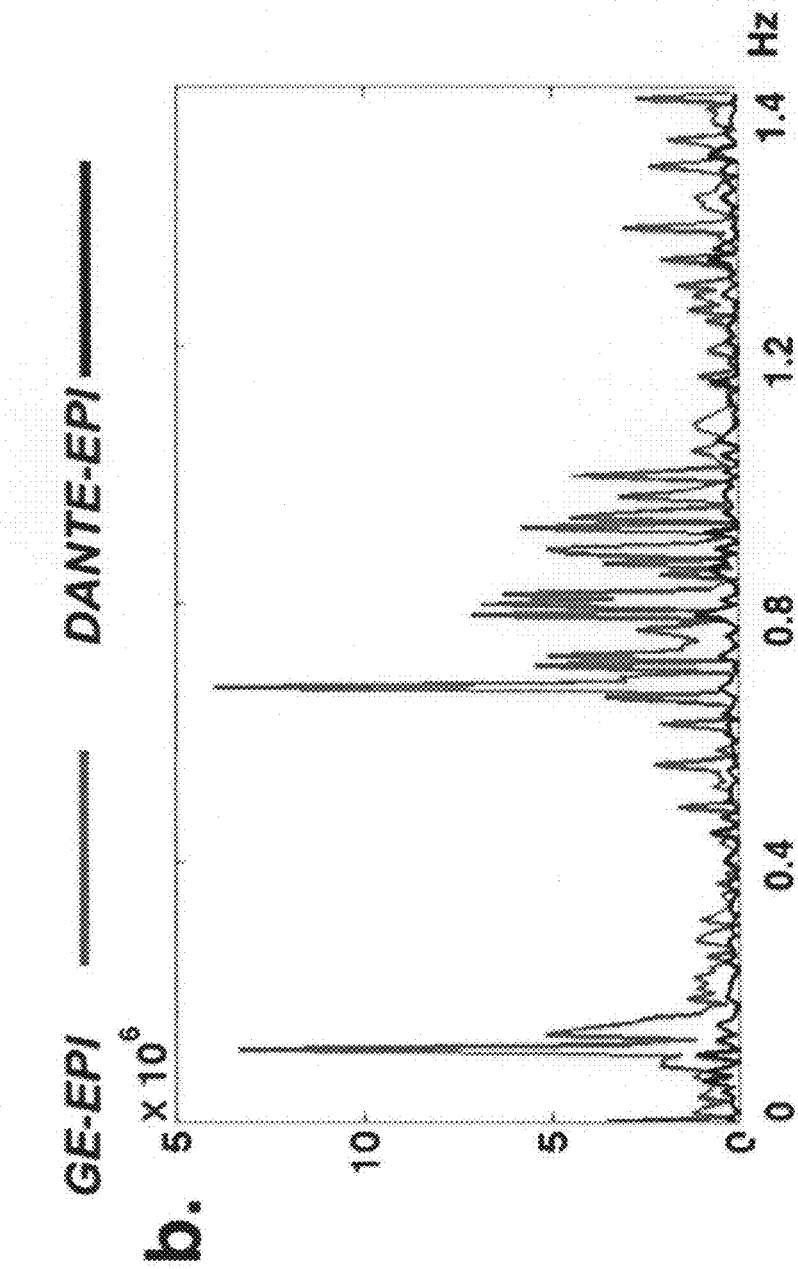
Figure 14C:
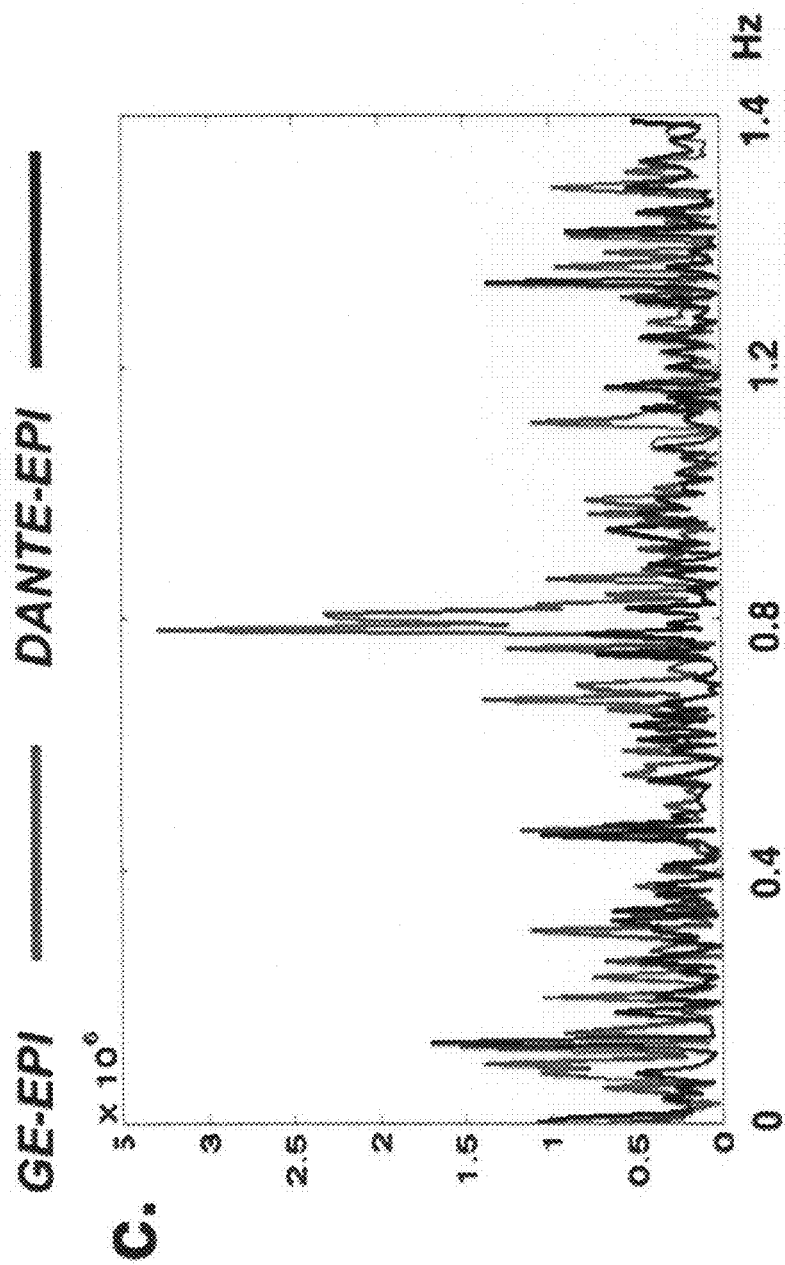
Figure 14D:
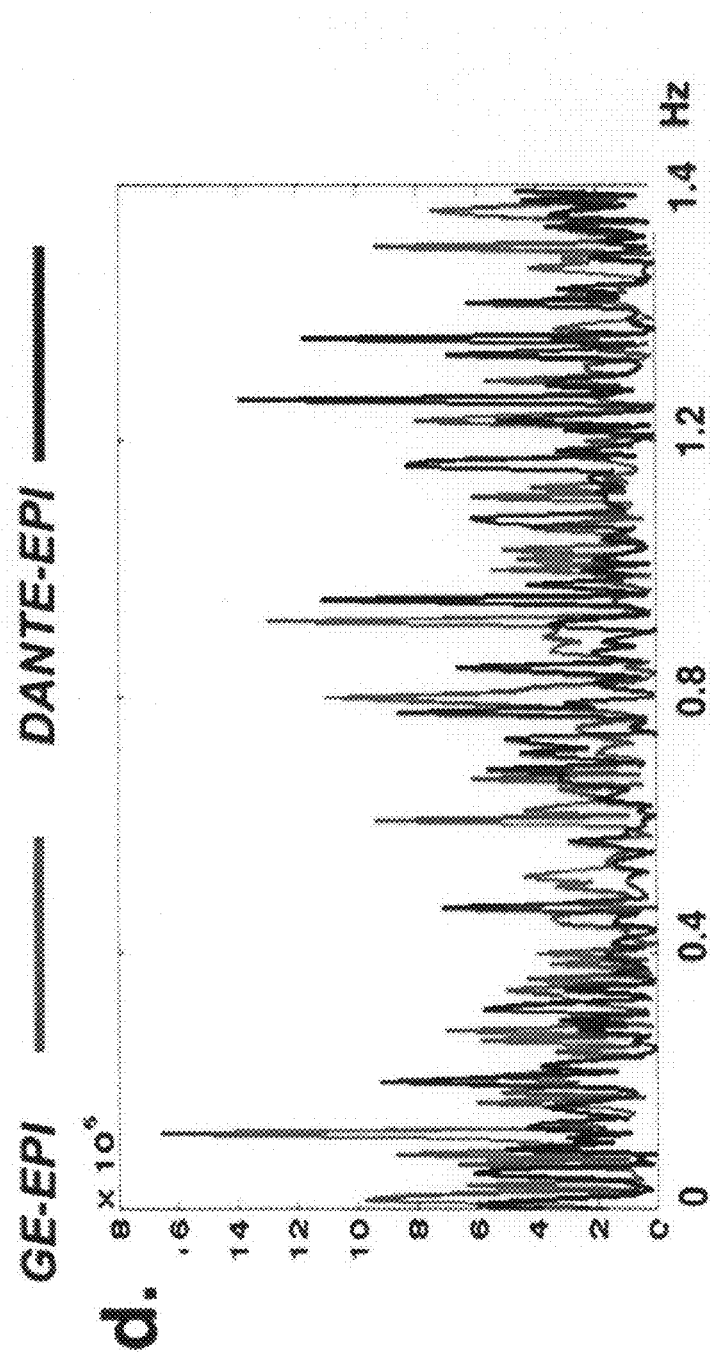
Figure 14E:
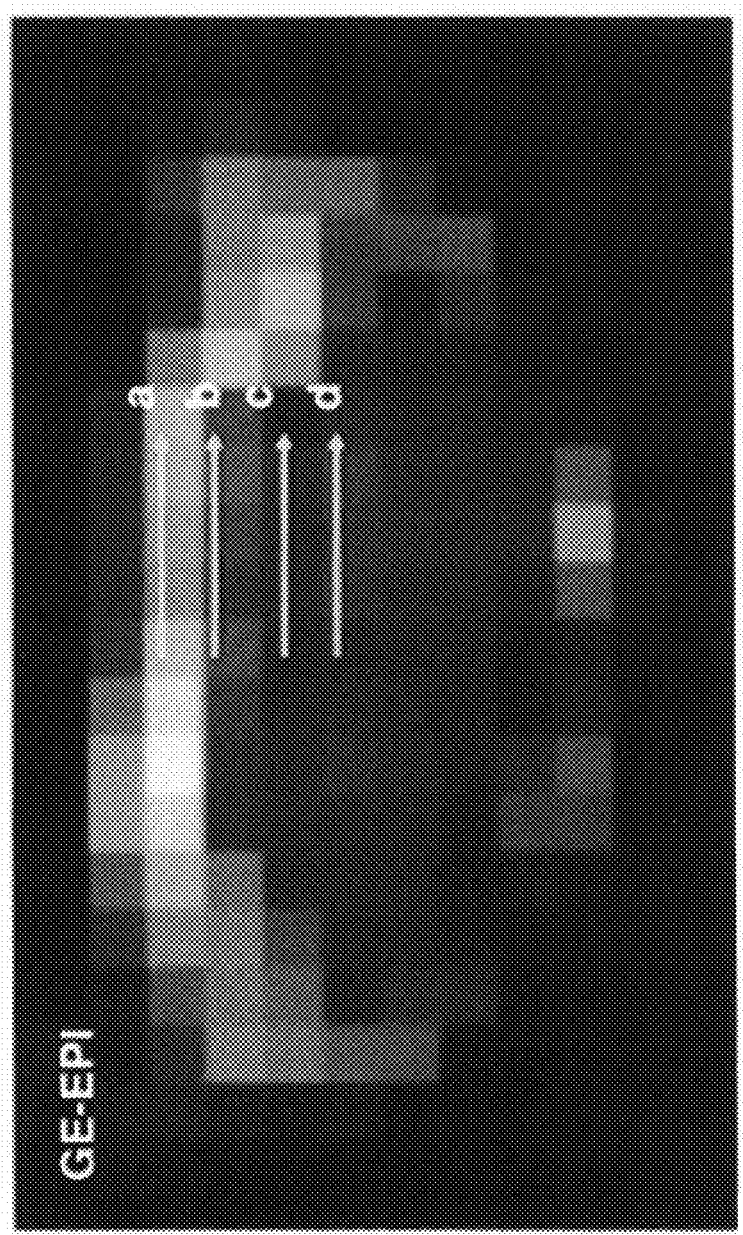
Figure 14F:
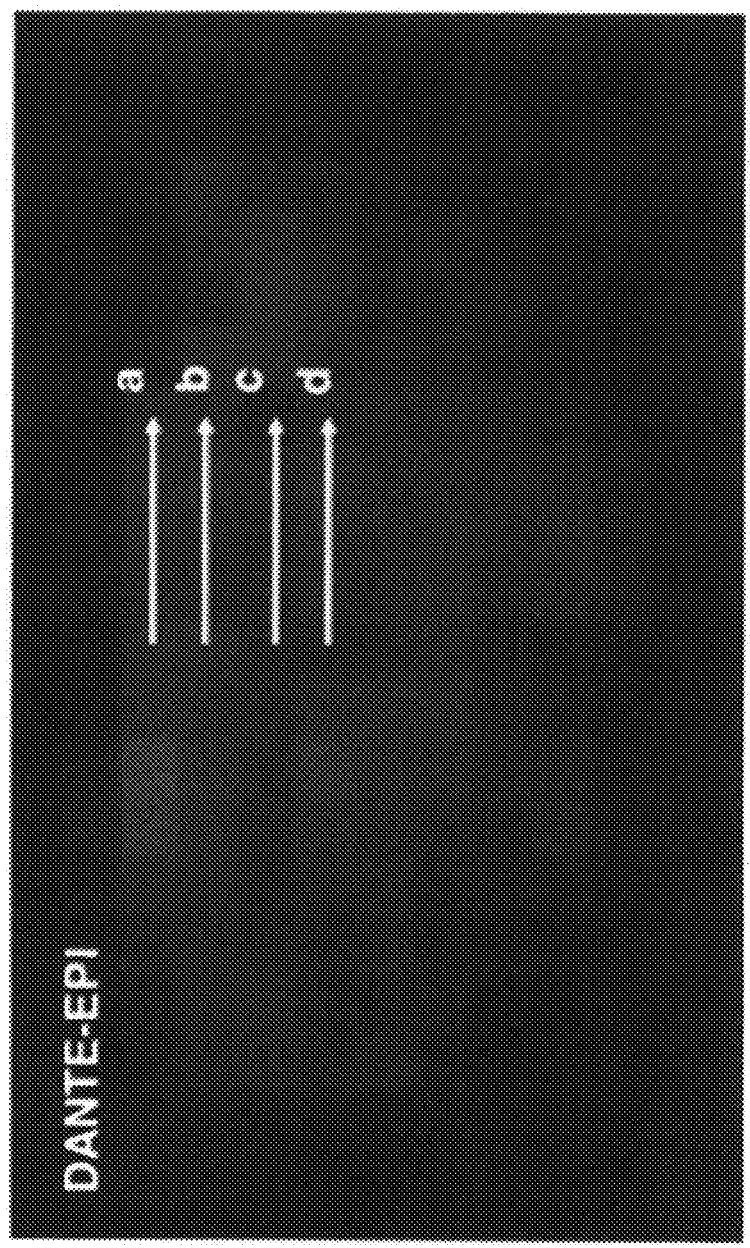

FIG. 13 demonstrates a banding artifact-free interleaved 28 multi-slice DANTE-BB imaging acquisition. For the assessment banding artefacts were minimized by selecting $t_D$=1 ms and a gradient amplitude of 18 mT/m, assuming a slice thickness of 2 mm. A flip angle ranging from 5-7° may then be selected. The DANTE-BB 2D TSE protocol for acquiring 22 contiguous slices in two and half minutes with a DANTE flip angle of 7° (Protocol 7 of Table 1) was run to illustrate a clinically relevant protocol. The resulting 2D contiguous slices, reconstructed into a 3D stack using multiple planar reconstruction (MRP), are shown in FIG. 13, demonstrating that the banding artefact for this set of parameters is not evident. The relevant parameters for image acquisition can be found in Protocol 7 of Table 1. FIG. 13a is the slice taken at location '1' in FIG. 13b. A carotid artery bifurcation image of this MRP image is shown in FIG. 13b, which was taken from the location marked as '2' in FIG. 13a. A spinal cord image from the MRP image is displayed in FIG. 13c, which was taken from the location marked as '3' in FIG. 13a. Both blood and CSF have been suppressed despite their very different velocities. The $CNR_{eff}$ was determined to be 36 $min^{-1/2}$. Spinal nerves can be observed in the sagittal view of spinal cord in FIG. 13d aided by the significant suppression of moving CSF signal. The spinal nerves are invisible to the MR spinal cord structure imaging techniques, such as MEDIC, due to hyper-intense CSF signal. In addition to the above-mentioned applications, the results for two other extensions to the DANTE method are described below:

1) Results of CSF flow suppressed spinal cord functional MRI data acquired using multi-slice DANTE-EPI are shown in FIG. 14. Mean signal image and power spectrum comparisons of conventional EPI (FIG. 14e) and DANTE-EPI (FIG. 14f) data (TR=300 ms) are shown for one subject as an example. The mean signal image shows that the DANTE prepared sequence successfully suppresses CSF signal surrounding the cord (bright "halo" in conventional EPI image). Four voxels (FIGS. 14a-d) extending from the CSF into the cord were selected from both data sets. It can be seen from the power spectrum of the voxel time courses that the DANTE prepared sequence substantially suppresses cardiac noise in the power spectrum (peaks at ~0.8 Hz) in CSF (FIG. 14a) and at the edge of the cord (FIG. 14b), however signal inside the cord is preserved (FIGS. 14c and 14d).

Figure 15:
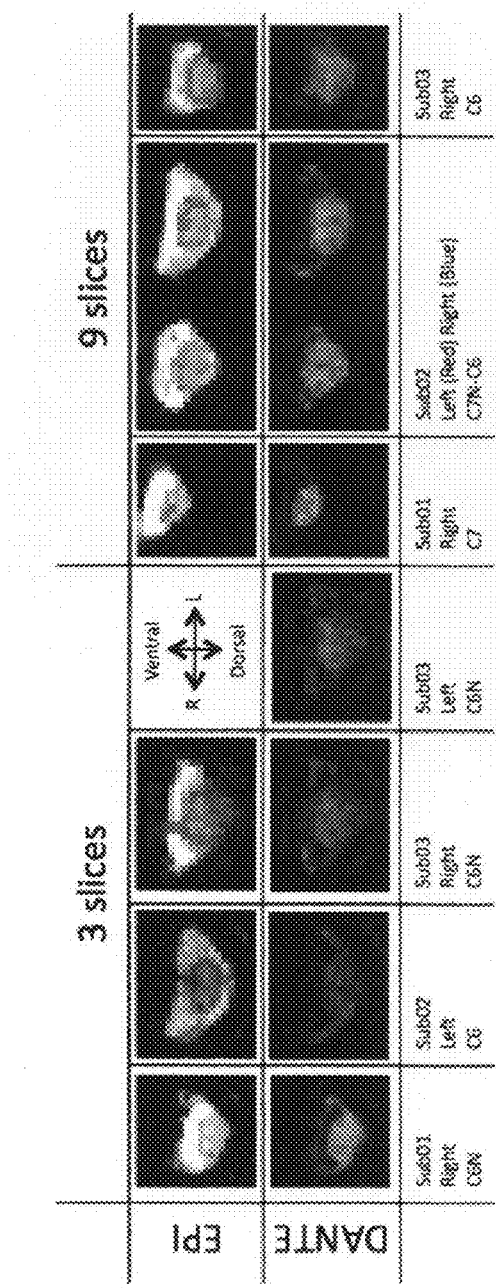
FIG. 15 shows comparisons of conventional GE-EPI fMRI and DANTE-EPI fMRI using right hand and left hand finger tapping tasks (3 slices and 9 slices with TR=2s). Stronger activation patterns from C6-C7 ventral area were observed for DANTE.

Activation maps for the motor task for the 3 slice and 9 slice protocols are shown in FIG. 15. FIG. 15 is a comparison of conventional GE-EPI and DANTE-EPI fMRI data using a right hand and left hand finger tapping task (3 slices and 9 slices with TR=2 s) are depicted. For the three slice-interleaved runs, DANTE-EPI outperformed the standard EPI sequence, showing a higher supra-threshold voxel count. In particular, activity for DANTE-EPI was primarily located in the ventral cord ipsilateral to the side of finger movement, which agrees with the known anatomical location of motor neurons within the spinal cord. With conventional EPI fMRI, activity was either absent or located primary within the CSF space (see "3 slices" Subject 3). For the nine slice-interleaved runs, similar patterns of activation were observed for Subject 01 and Subject 03, but not for Subject 02—with more diffuse activity located throughout the cord (particularly for the DANTE-EPI acquisition).

2) Results of digital subtraction non-contrast agent MR angiography using DANTE-GRE.

Figure 16:
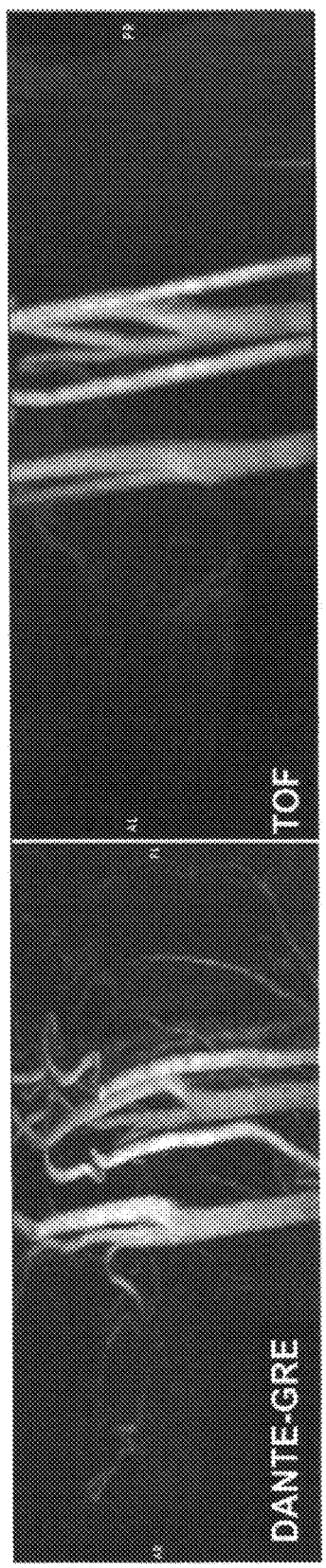
FIG. 16 shows preliminary data demonstrating a comparison of a digital subtraction DANTE angiography sequence (left) and the equivalent conventional TOF angiogram (right). Superior visualization of small vessels is already evident in the DANTE dataset.

FIG. 16 shows preliminary data collected in a highly non-optimized manner, but illustrating the potential of the approach. The data shown in FIG. 16 were collected by subtraction of two DANTE-prepared GRE datasets, one with a zero flip angle (to preserve the blood signal) and one with non-zero flip angle (to suppress the blood signal) and with no optimization of the flow compensation and acquisition parameters. FIG. 16 is the preliminary data presenting a comparison of the digital subtraction DANTE angiography sequence (left) and the equivalent conventional TOF angiogram (right). Note that no optimization was attempted for the DANTE angiogram, and a pulse sequence with long time intervals between the tag and control conditions was used, exposing the dataset to potential motion artifacts. Nevertheless, superior visualization of small vessels is already evident in the DANTE dataset.

Quantitative Evaluation

Figure 17:
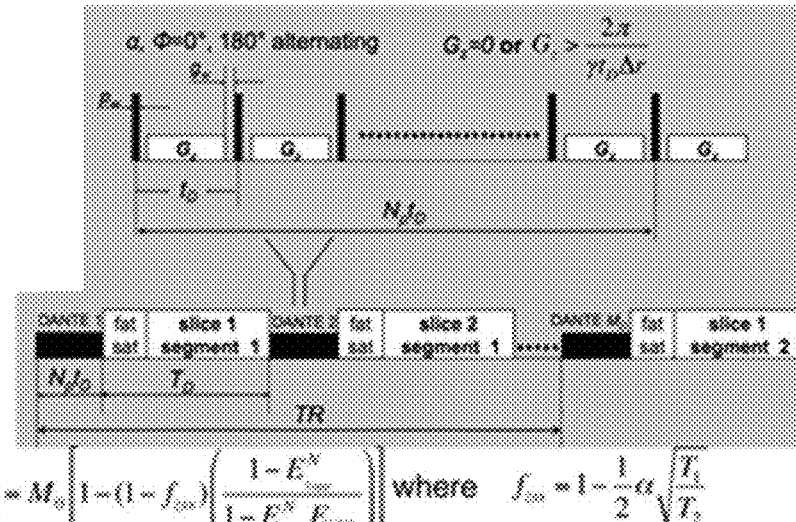
FIG. 17 depicts an implementation of the Bloch equation simulations of FIG. 2a and FIG. 2b in a DANTE pulse sequence for a quantitative evaluation of an embodiment of the present disclosure.
Figure 18:
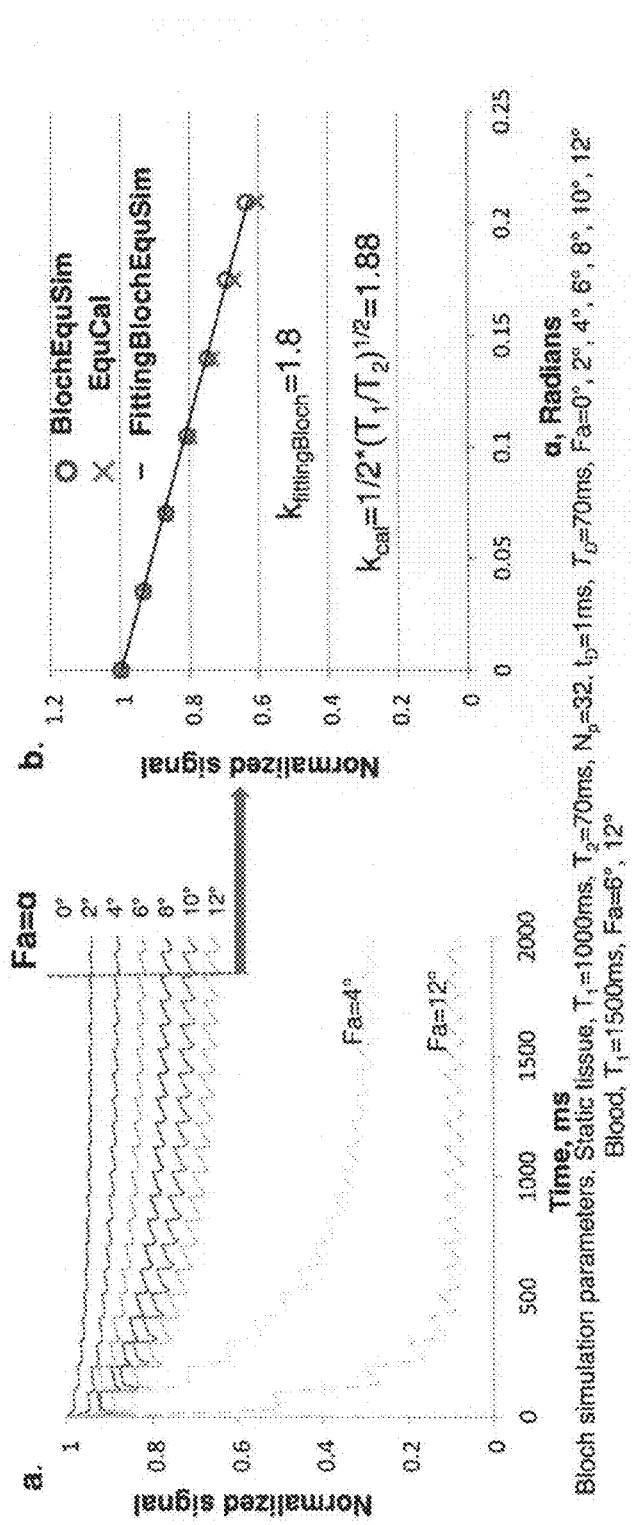
FIG. 18 depicts a Bloch simulation for verification of derived signal equations for the embodiment of FIG. 17.
Figure 19:
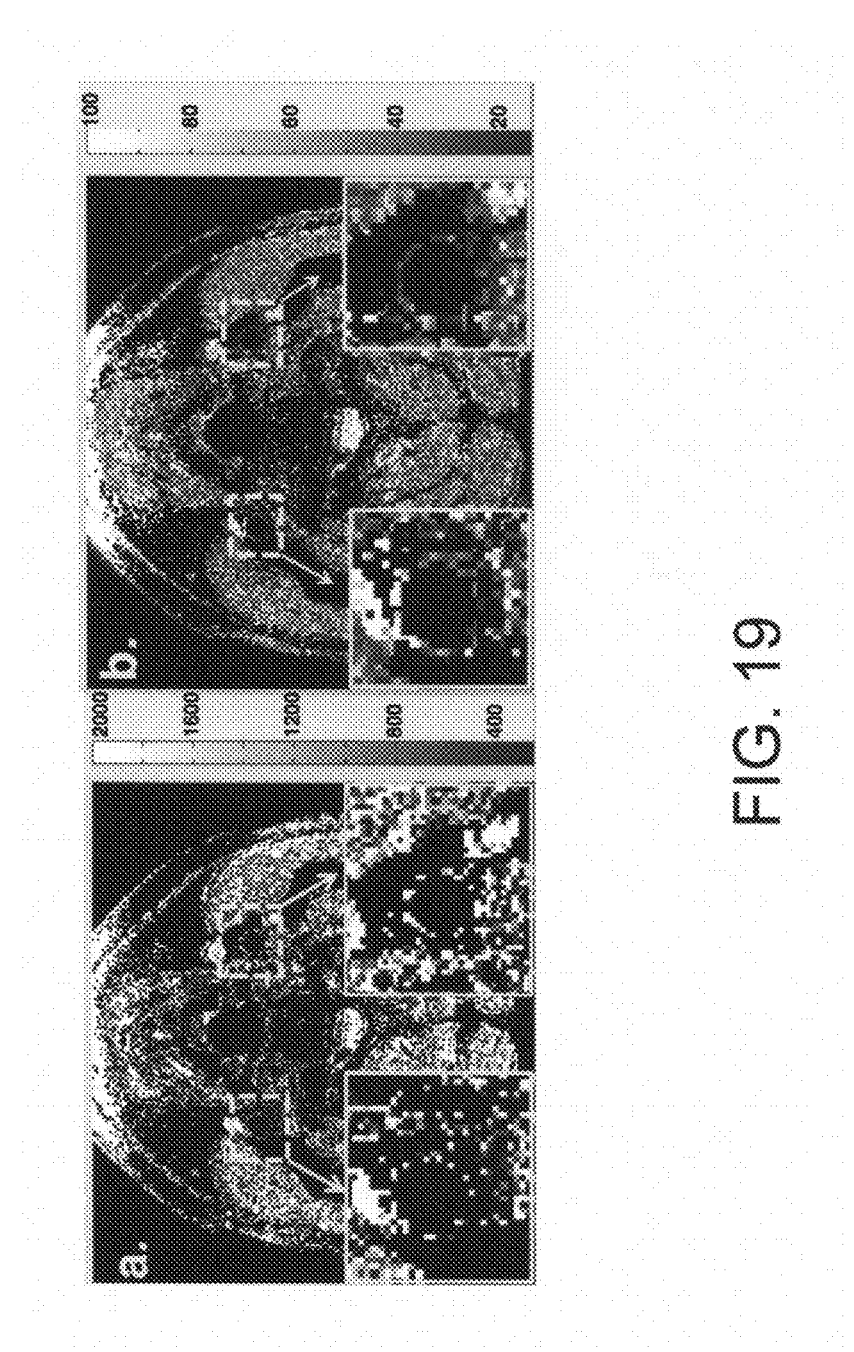
FIGS. 19a and 19b show (a) $T_1$ and (b) $T_2$ maps of a carotid artery wall.
Figure 20:
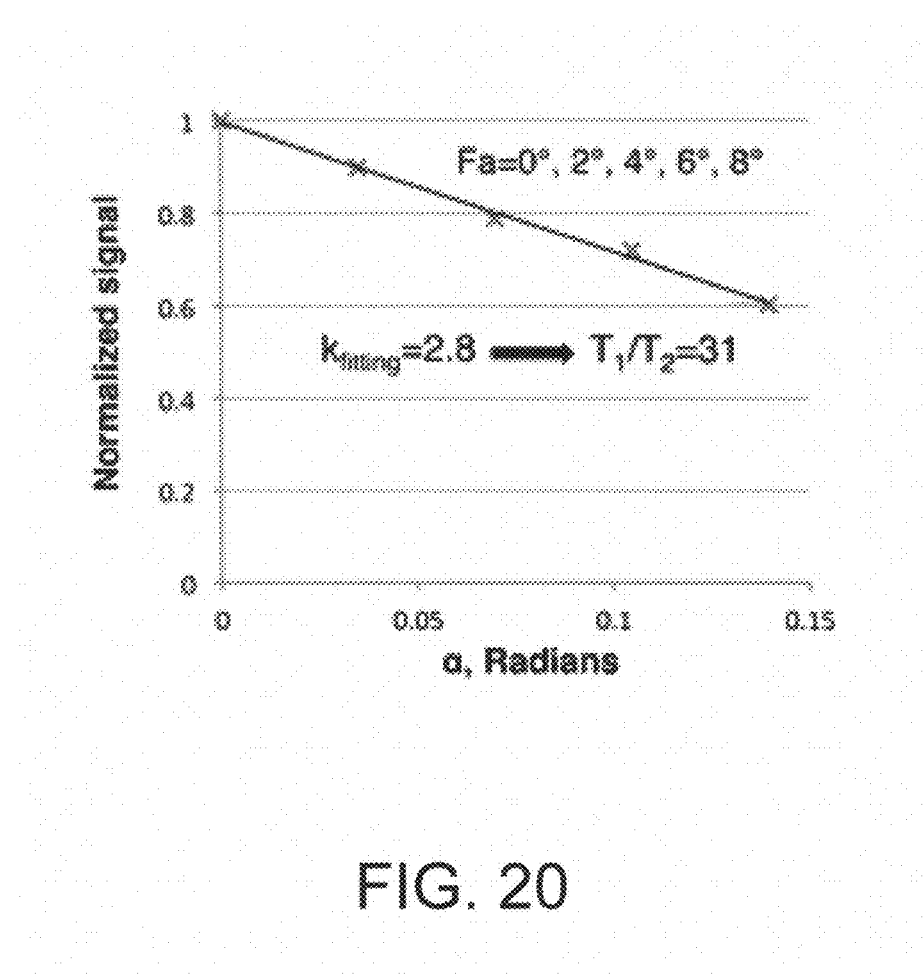
FIG. 20 shows muscle signal linearly v. DANTE α for the embodiment of FIGS. 17-19.

Bloch equation simulations according FIG. 17, were implemented under the assumed parameters shown in FIG. 18 as an initial verification of linear equation. The solid lines in FIG. 18a show the longitudinal signal of static tissue with different DANTE $\alpha$. The blood signal is shown as dashed lines demonstrating that when $\alpha > 4°$ the blood signal may be ignored. Extracted static tissue signal from these Bloch simulations is shown in FIG. 18b (blue circles). For comparison, the red crosses in FIG. 18b are calculated from the linear equation with varying $\alpha$. This shows good agreement between Bloch simulation and the prediction of the simplified equation. For in-vivo assessment, $T_1$ and $T_2$ maps of the carotid artery wall are shown in FIGS. 19a and 19b, respectively. They are created from the three image measurements described earlier herein. In order to demonstrate the linear relationship of true tissue signal versus $\alpha$, signal from the muscle ROIs shown in FIG. 19 (red circles) was extracted from measurements with $\alpha = 0, 2, 4, 6, 8°$ all with TSE TE=19 ms. The fitting results in FIG. 20 show that the $T_1/T_2$ ratio of muscle is 31. Given that the $T_2$ in the ROI is determined to be 40 ms, this implies a $T_1$ of 1240 ms. Independent single-slice inversion recory $T_1$ measurements determined $T_1$ at the same location as 1108 ms, which agrees reasonably with our fitting results, demonstrating the use of blood suppressed 2D DANTE-TSE for fast relaxation time mapping in human carotid artery wall Discussion In general we see a good agreement between theory and experiment. The suppression pattern for moving spins in FIG. 6a is seen to agree well with Eqn 19, which is derived from the Bloch equations assuming full spoiling of the magnetization following each pulse in the present DANTE pulse train. An alternative simple model is to note that the short value of $t_D$ (1 ms) and the long value of $T_1$ for water (approx. 2.5 s) lead to the result that $\exp(-t_D/T_1) \approx 1$, allowing the fluid suppression in FIG. 6a to be roughly characterized by $M = M_0 (\cos \alpha)^{N_p}$ in the regime where the $T_D$ duration between DANTE modules is long. In this case, FIG. 6b demonstrates a robust linear relationship between $\ln(M/M_0)$ and $\ln(\cos \alpha)$. The slope derived by linear fitting was determined to be 157, which is about a 5% deviation from the actual value of $N_p = 150$ employed in the experiment. This suggests that the images in FIG. 5 are pure spin density images, independent of the relaxation times of the moving spins. Thus, a single measurement of the residual signal of M can be enough to determine the moving fluid proton density, $M_0$, since $\alpha$ and $N_p$ are known measurement parameters. For the static spins, however, there is almost no signal suppression due to the establishment of a transverse coherence. It is well known that the steady state magnetization for static spins ($M_{pss,z}$ here) reaches a maximum value when $T_1$ is equal to $T_2$, which was the case of the phantom used for the data shown in FIG. 6a. In more realistic situations, there is a several fold difference between the $T_1$ and $T_2$ relaxation times of muscle at 3 T. This difference will cause more signal decay than is the case in FIG. 6a.

For the in vivo data shown in FIG. 8 it is noted that there is a slightly larger deviation between the theoretical prediction and experimental measurement for CSF. This is likely due to the interaction between DANTE modules given the long $T_1$ of CSF ($\approx 3$ s at 3 T), since effectively the $T_D$ value of 2 s employed in the protocol is not long enough to avoid this interaction for moving CSF. In such cases, combination of Eqns 9 and 20 may be used for a more accurate calculation. It is well known that the flow velocity of blood in the large arteries of the neck is about 10-20 cm/s whereas the flow velocity of CSF is about 1-2 cm/s or less. The large difference in flow velocity between these two species does not cause large differences of signal decay pattern, providing further in vivo evidence for the flow velocity insensitivity of the present DANTE module. This velocity insensitivity of the DANTE preparation is potentially very important in medical imaging for suppressing signal from fluids with complex motion or flow patterns, such as blood and CSF.

One complication in using the present DANTE preparation for moving spin signal suppression is that it leads to the well-known off-resonance SSFP banding effect in the slice (z) imaging direction [25]. This means that a gradient applied within the DANTE pulse train along the z direction will spatially modulate $M_z$ in that direction, resulting in slice intensities with periodic intensity. In practice there will be a maximum slice coverage that is possible without a banding artifact that can be calculated from the gradient moment and pulse interval. The separation of these bands is inversely related to the gradient moment, $\Delta r = 2\pi/\gamma t_D G_z$, where $\Delta r$ is the band separation. This modulation in static spin suppression can be avoided by carefully adjusting the combination of imaging position and gradient amplitude [25]. Alternatively, the problem can be reduced by choosing a small enough gradient amplitude such that the banding size is larger than the slice dimension field of view. This, however, could potentially compromise the motion or flow crushing effect [11].

Conversely, when the gradient moment is large enough the banding separation can be smaller than the slice thickness, in which case the slice intensity is determined by the averaged signal from the banding pattern within the slice [26], as is done successfully in Protocols 6 and 7. The required gradient moment to achieve this condition can be achieved with a sufficiently large value of $t_D$. However a larger value of $t_D$ and a consequent reduction in the number of RF pulses in the present DANTE train (for fixed DANTE duration) leads to a larger value of $M_{ss,z}$ for moving spins, via Eqn 18, and hence to less BB suppression. To maintain a low $M_{ss,z}$ value a larger flip angle is preferred in the protocol, which correspondingly causes lower SNR in static tissue and increases the SAR.

The theoretical and experimental validations described above show that the DANTE-BB effect can be quantitatively controlled using three experimental parameters: flip angle, α; number of pulses in the train, $N_p$; and pulse repetition time within the DANTE train, $t_D$. It was found that varying the flip angle provides the easiest way to control the BB effect. In practice this mechanism is more flexible and realistic than altering $N_p$ or $t_D$. One reason is that the degree of moving signal suppression is only linearly proportional to $N_p$ and $t_D$, but is proportional to the square of the flip angle. The other reason is that the value of $N_p$ is limited by the DANTE duration, which should be as short as possible in order to accommodate the maximum number of readout segments per unit time. None of the current BB methods have the same capability and flexibility for BB control, indicating that the present DANTE-BB technique may offer advantages for clinically discriminating between residual blood signal and plaque when compared with conventional techniques.

In FIG. 13a, contrast between grey matter and white matter in the spine can be observed, albeit not clearly. Note that the current sequence was not purposely designed for grey/white matter contrast, and that higher contrast between grey and white matter would be expected with further optimization of the readout protocol for imaging spinal core structure. In FIG. 13c, it is observed that there is significant signal suppression of moving CSF fluid. Given the fast imaging speed of interleaved acquisition, this suggests that the present DANTE-BB preparation may be employed as an alternative method to FLAIR (Fluid Attenuation Inversion Recovery) in imaging of spinal cord. Whereas FLAIR attenuates all fluids around the spinal cord, the DANTE sequence may allow discrimination between moving fluids and stationary fluids. This feature may offer the opportunity to observe stationary fluids, such as cysts and oedema, adjacent to moving CSF fluid. In FIG. 13d, the structure of spinal nerve can be observed since the hyper-intense CSF signal is largely suppressed by the DANTE-TSE sequence.

FIGS. 14 and 15 demonstrate that the combination of DANTE with an EPI readout is an effective method to eliminate physiological noise in spinal cord fMRI by minimizing the influence of motion and flow artefacts due to prominent cerebrospinal fluid (CSF) signal. Such noise processes would normally be a significant problem for conventional spinal cord fMRI.

Finally, FIG. 16 shows preliminary data demonstrating a comparison of the proposed digital subtraction DANTE angiography sequence (left) and the equivalent conventional TOF angiogram (right). Note that no optimization was attempted for the DANTE angiogram, and a pulse sequence with long time intervals between the tag and control conditions was used, exposing the dataset to potential motion artifacts. Nevertheless, superior visualization of small vessels is already evident in the DANTE dataset, suggesting its value as an endogenous contrast angiographic imaging technique.

Also, the present DANTE-BB preparation appears to have minimal sensitivity to the precise velocity for values above an approximate threshold of 0.1 cm/s. This creates a good quality of BB effect even in the case of complex motion profiles found in vivo. It is worth noting that the present DANTE moving spin suppression module may also have sensitivity to perfusion. Thus, the systems and methods disclosed herein provide a method for quantitative relaxation time mapping of both static tissue, such as muscle and plaques, and of moving fluids such as blood and CSF.

We have shown that the present systems and methods can be employed for moving spin suppression in practical 2D or 3D black blood magnetic resonance imaging, allowing accurate morphology measurement and pathology diagnosis of vessel walls. When the DANTE preparation module is employed with TSE, GRE, EPI or GRASE readout modules, the overall pulse sequence becomes a hybrid sequence with the features of SSFP (static spins), RF-spoiled GRE (moving spins), plus weighting imparted by the readout sequence, such as TSE or any readout sequence as desired. Additionally, unlike conventional SSFP, which lacks the ability to achieve pure $T_1$ and $T_2$ weighting, this hybrid sequence is able to achieve $T_1$ and $T_2$ weighted images by simply changing TR and TE, respectively, in the readout spin echo sequence. Indeed, simple simulations (not shown) indicate that the effect on the static tissue $M_z$ of the DANTE pulse train with parameters used in this study modulate the signal by at most 5-10% over a wide range of biologically relevant $T_1$ and $T_2$ values. Thus, the majority of the static signal contrast is imparted by the readout sequence.

Likewise the interlaced DANTE preparation pulse trains shown here would be preferred over a pure SSFP sequence for combined readout and BB preparation. This is because: (i) a balanced SSFP sequence would provide less BB effect than one with a residual moment (as we use here); (ii) optimizing contrast between static and moving spins in a pure SSFP acquisition would require much higher flip angle than used in our studies, incurring significant SAR limitations, while the low flip angles employed in some embodiments of our preparation trains would greatly reduce the signal from static tissues (since balanced SSFP at low flip angle exhibits a 'reversed profile' with low signal on resonance, see FIG. 3 in [22]); (iii) 2D imaging would be precluded by the use of non-selective imaging pulses; and (iv) only the standard $T_2/T_1$ image contrast would be available with SSFP readouts.

An alternative way to understand the difference between the present DANTE-BB method and conventional methods is that most conventional methods either minimally manipulate the static spins in the imaging plane, such as for spatial pre-saturation approaches [13,14], or immediately flip the static spins back to the longitudinal direction after preparation, such as for DIR and MSDE approaches. In contrast, the present DANTE preparation method aims to manipulate both the static and moving spins, in order to differentiate them via their different steady state signal behaviours. The manipulation may be conducted both optimally and simultaneously. As such, the DANTE method is naturally adapted to multi-interleaved acquisition, which requires repetitions of the preparation module, sometimes frequent repetitions.

In cases where an intra-vascular contrast agent is used the $T_1$ of the blood would decrease significantly, requiring altered DANTE pulse train parameters to maintain an efficient BB effect. We would predict that if a higher flip angle of 13° was chosen for the present DANTE pulse train in conjunction with a pulse interval of 0.4 ms then the relative $M_z$ values for static and moving spins (with $T_1$=100 ms for the latter) would be 60-65% and 15%, respectively, suggesting that a BB effect could still be achieved. In general, however, the DANTE-BB preparation module may utilize only low flip angle pulses, and should result in greatly reduced specific absorption rate (SAR) problems at higher magnetic field strengths (3 T and 7 T). This should allow more slice or slab acquisitions to be achieved per unit time, and hence increase the time efficiency of image acquisition.

Should cardiac gating be desired it should be possible to use the flexibility of the present DANTE BB module to enable such gating. The duration of the DANTE train is highly flexible, allowing values from below 30 ms up to an arbitrarily long time, depending on the in vivo tissue properties and imaging requirements. The repetition rate of the DANTE modules is also highly flexible, allowing values from 1 module/sec to 5-6 modules/sec, or higher. In the case of Protocol 7, Table 1, the DANTE duration is only 64 ms, which is relatively short (although regularly repeated). With this degree of flexibility it should be possible to incorporate cardiac gating into the sequence, albeit with careful attention to maintaining a hybrid steady state. It may also be desirable for cardiac gating to use strategies to ensure a rapid achievement of steady-state. In general, however, they will not be needed, given the rapid arrival at steady state of the DANTE effect (approx. 1.5 secs) relative to the typical duration of a multi-slice imaging experiment (1-2 mins). Finally, we note that distorted gradients would have little effect on the moving spin signal, but could affect the static signal, since phase preservation is a requirement for the static signal. We have pushed the parameters on our scanner by using a DANTE $t_D$ of 500 µs and a gradient amplitude 18 mT/m (data not shown) and have seen no apparent static tissue signal loss.

CONCLUSION

We have described herein new systems and methods that use a train of RF pulses in combination with field gradient pulses between the RF pulses to drive the static tissue into a steady state, for example a transverse steady state. The train may be repeated regularly. The magnetization of static tissue, for example, along the longitudinal direction loses very little signal, with the majority of the magnetization being preserved for use in image acquisition. Conversely, moving spins (such as blood and CSF), given the same conditions, do not establish steady state (for example, a transverse steady state) due to phase accumulation caused by flow along the applied gradient. As a result, the magnetization of flowing spins, for example longitudinal magnetization, is largely or even fully suppressed. The present DANTE-BB preparation technique thus creates a contrast in magnetization between the steady state of static spins and the non-steady state (or progressive saturation) of moving spins. It can be incorporated into any existing imaging readout for applications in vessel wall imaging, angiography, high resolution structural MRI, and also functional MRI.

In various aspects the systems and methods may use a magnetic resonance imaging device to generate a preparation sequence, for example, with non-selective flip angle α (generally 1°-90°, best 3°-30°) RF pulses with a certain phase pattern (such as either with constant 0° phase or with alternating 0° and 180° phase). The number of pulses in an individual RF train can vary, for example, from 1 to an arbitrarily large number. The time interval $t_D$ between each pulse can vary upwards from 100 µs.

The magnetic resonance imaging device, can apply magnetic field gradient pulses in between the RF pulses described herein with the gradient amplitudes varying from 0 to the maximum value provided by the scanner.

The magnetic resonance imaging device can also apply multi-slice or multi-slab interleaved or single slice imaging acquisition with the pulse or pulse group described herein applied before each of the imaging readouts or imaging readout segments.

In general, the system and methods can be adapted to any applications where contrast between moving and stationary spins is desirable. In various aspects the systems and methods may be employed for one or more of the following applications, among others:

1. Moving spin suppression in 2D or 3D Black Blood (BB) magnetic resonance imaging (MRI), allowing accurate morphology measurement and pathology diagnosis in MRI of vessel walls.
2. CSF flow quantification and suppression, allowing for example accurate multiple sclerosis evaluation or diagnosis in spinal cord (structural imaging) or physiological noise elimination in spinal cord neuroscience studies (e.g., spinal cord functional MRI).
3. A superior alternative to conventional magnetic resonance time-of-flight (TOF) angiography when used in digital subtraction mode, in order to allow smaller vessels to be resolved due to the method's superior static signal cancellation (and without the use of exogenous contrast, for example in angiographic imaging).
4. For use in combination with functional MRI approaches to achieve intravascular blood suppressed blood oxygen level dependent (BOLD) signal for better localization and quantification of neural activity.
5. For blood suppressed MRI interventional techniques (real time imaging) requiring images where the moving spin signal is suppressed.
6. To obtain quantitative measures of $T_1$, $T_2$ and proton density in BB images of atherosclerotic plaques in the large cranial and intra-cranial vessels, as well as in the aorta, and that these measures can be made with greater spatial coverage and with shorter scan times than existing methods.
7. For perfusion MRI measurement for research and clinical application.

In summary, the system and methods can be adopted to any application where contrast between moving and stationary (static) spins is desirable.

The advantages or benefits of our approach include:

1. Simplicity. No extra hardware, and minimal additional sequence coding or restrictive timing is required in order to incorporate the preparation in combination with existing standard readout sequences and equipment.
2. High contrast between moving and static spins. The present systems and methods offer a superior ability of suppressing flowing blood and CSF signal whilst preserving static tissue signal, which yields improved assessment of, for example, arterial vessel walls and spinal cord. Compared with the most common Double Inversion Recovery (DIR) method for black blood imaging, which has been commercialized, the proposed DANTE method has comparable $CNR_{tis\_lum}$ (contrast-to-noise ratio between tissue and lumen), better black blood (BB) quality, and imaging speeds 2-6 times faster than DIR for equivalent signal-to-noise ratio (SNR). In comparison with the other common black blood preparation module (known as motion sensitive driven equilibrium, MSDE), the presently disclosed method has comparable BB quality, higher $CNR_{tis\_lum}$ and 2-3 times shorter imaging times with at least 50% higher SNR.

3. Flexible and quantitative in controlling flow suppression and achieving static tissue relaxation contrast. For example, by changing the pulse train flip angle, it is easy to quantitatively control the flowing blood suppression effect. None of the existing BB imaging modules has this capability, which is particularly important for clinicians to distinguish residual blood signal and plaque. By incorporating different readout imaging parameters, the present method may be used flexibly to create anticipated static tissue relaxation contrast, such as $T_1$, $T_2$ and proton density weighting.

4. Low SAR (specific absorption rate). The present DANTE method has lower SAR restrictions compared to conventional BB approaches, especially at higher magnetic field (3 T and 7 T) because of the application of multiple small flip angle pulses, rather than the higher flip angle pulses used in conventional methods. DIR and MSDE methods in general will have higher SAR levels providing benefit at high magnetic field due to, for example, application of 90 and/or 180 degree pulses.

5. High speed with low signal loss in 2D multi-slice and 3D multi-slab acquisitions. The present systems and methods lend themselves naturally as a preparation module for 2D multi-slice and 3D multi-slab BB imaging acquisition with high imaging sensitivity. Conversely, the commercialized DIR method, although attempted in a 2D multi-slice mode, has never been successfully deployed for true multi-slice acquisition because of its complexity and compromised black blood quality. In addition, the DIR method has substantial limitations when employed for multi-slab 3D black blood imaging acquisitions, due to the restrictions of its BB suppression mechanism. The alternative MSDE method can be used for 2D and 3D multi-slice and multi-slab black blood imaging acquisitions. However, it suffers serious reductions in imaging SNR because of unavoidable signal decay caused by $B_1$ inhomogeneity, diffusion signal loss, and $T_1$ and $T_2$ relaxation decay.

6. Robust flow suppression effect. The present DANTE module can be made insensitive to flow velocity (above a low threshold). This is significant for in vivo flow artifact free medical imaging, given the complicated flow patterns and wide velocity distributions in blood and CSF fluids caused by their pulsatile flow.

7. The duration of each DANTE BB module is highly flexible allowing values from below 1 ms up to an arbitrarily long time, depending on the in-vivo tissue properties and imaging requirements.

8. The repetition of the DANTE modules is also highly flexible, allowing values from 1 module/sec to 5-6 modules/sec, or an even higher repetition rate. This also tailors image contrast.

Figure 21:
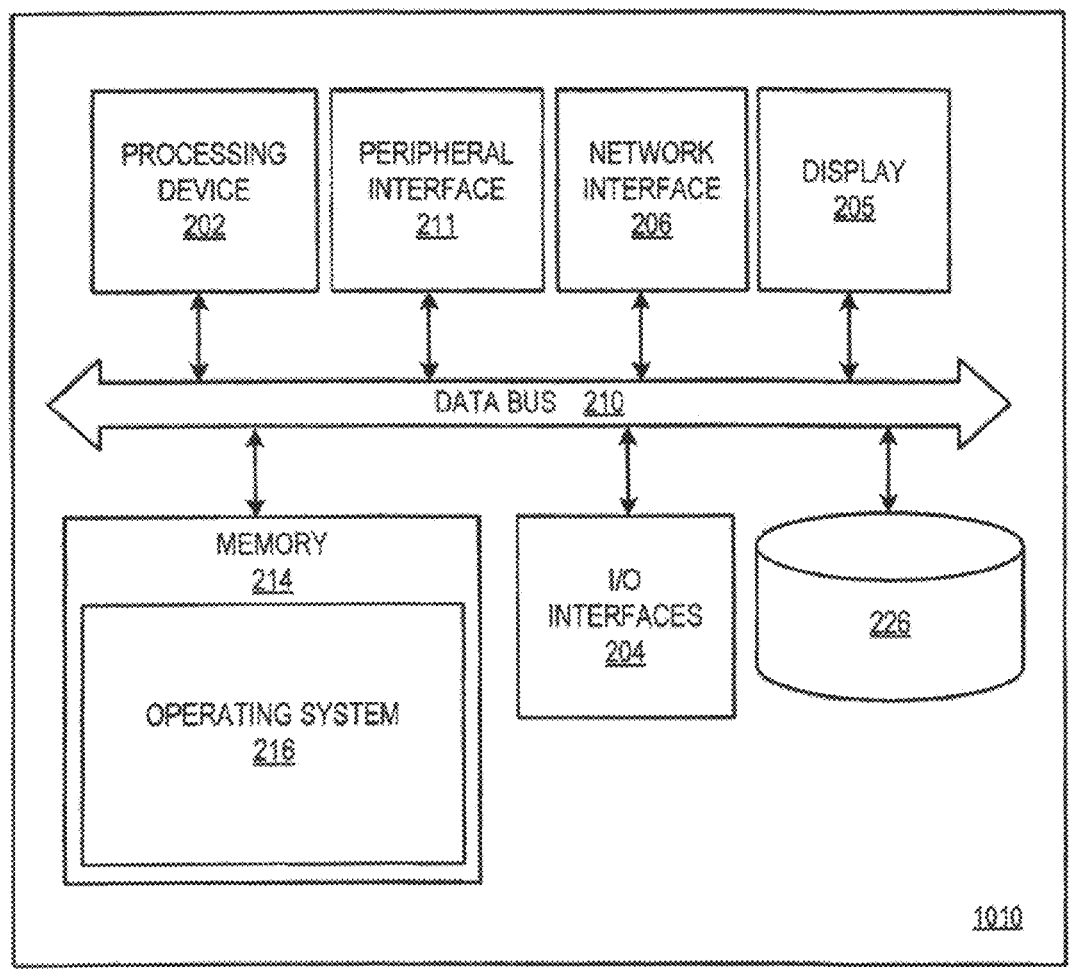
FIG. 21 is a schematic block diagram of an apparatus in which embodiments for providing motion sensitized and motion suppressed imaging disclosed herein may be implemented.

Reference is now made to FIG. 21, which depicts an apparatus 1010 in which the embodiments of systems and methods for providing motion sensitized and motion suppressed quantitative imaging described herein may be implemented. The apparatus 1010 may be embodied in any one of a wide variety of wired and/or wireless computing devices, multiprocessor computing device, and so forth, in particular as part of a magnetic resonance imaging (MRI) system. As shown in FIG. 21, the apparatus 1010 comprises memory 214, a processing device 202, a number of input/output interfaces 204, a network interface 206, a display 205, a peripheral interface 211, and mass storage 226, wherein each of these devices are connected across a local data bus 210. The apparatus 1010 may be coupled to one or more peripheral measurement devices (not shown) connected to the apparatus 1010 via the peripheral interface 211.

The processing device 202 may include any custom made or commercially available processor, a central processing unit (CPU) or an auxiliary processor among several processors associated with the apparatus 1010, a semiconductor based microprocessor (in the form of a microchip), a macroprocessor, one or more application specific integrated circuits (ASICs), a plurality of suitably configured digital logic gates, and other well-known electrical configurations comprising discrete elements both individually and in various combinations to coordinate the overall operation of the computing system.

The memory 214 can include any one of a combination of volatile memory elements (e.g., random-access memory (RAM, such as DRAM, and SRAM, etc.)) and nonvolatile memory elements (e.g., ROM, hard drive, tape, CDROM, etc.). The memory 214 typically comprises a native operating system 216, one or more native applications, emulation systems, or emulated applications for any of a variety of operating systems and/or emulated hardware platforms, emulated operating systems, etc. For example, the applications may include application specific software or code which may be configured to perform some or all of the systems and methods for providing motion sensitized and motion suppressed quantitative imaging for the medical and neuroscience applications described herein. In accordance with such embodiments, the application specific software is stored in memory 214 and executed by the processing device 202. One of ordinary skill in the art will appreciate that the memory 214 can, and typically will, comprise other components which have been omitted for purposes of brevity.

Input/output interfaces 204 provide any number of interfaces for the input and output of data. For example, where the apparatus 1010 comprises a personal computer, these components may interface with one or more user input devices 204. The display 205 may comprise a computer monitor, a plasma screen for a PC, a liquid crystal display (LCD) on a hand held device, or other display device.

In the context of this disclosure, a non-transitory computer-readable medium stores programs for use by or in connection with an instruction execution system, apparatus, or device. More specific examples of a computer-readable medium may include by way of example and without limitation: a portable computer diskette, a random access memory (RAM), a read-only memory (ROM), an erasable programmable read-only memory (EPROM, EEPROM, or Flash memory), and a portable compact disc read-only memory (CDROM) (optical).

With further reference to FIG. 21 network interface device 206 comprises various components that can be used to transmit and/or receive data over a network environment to other components in an MRI system. For example, the network interface 206 may include a device that can communicate with both inputs and outputs, for instance, a modulator/demodulator (e.g., a modem), wireless (e.g., radio frequency (RF)) transceiver, a telephonic interface, a bridge, a router, network card, etc.). The apparatus 1010 may communicate with one or more computing devices (not shown) via the network interface 206 over a network 118. The apparatus 1010 may further comprise mass storage 226. The peripheral 211 interface supports various interfaces including, but not limited to IEEE-1394 High Performance Serial Bus (Firewire), USB, a serial connection, and a parallel connection.

The apparatus 1010 shown in FIG. 21 may be embodied, for example, as a magnetic resonance apparatus that includes an image acquisition system, and which includes a processing module or logic for performing conditional data processing, and may be implemented either off-line or directly in a magnetic resonance (MR) apparatus. For such embodiments, the apparatus 1010 may be implemented as a multi-channel, multi-coil system with advanced parallel image processing capabilities, and direct implementation makes it possible to generate immediate images available for viewing immediately after image acquisition, thereby allowing re-acquisition on-the-spot if necessary. Examples of apparatus in which the present systems and methods may be implemented are described in U.S. Pat. No. 5,993,398 and U.S. Pat. No. 6,245,027 and U.S. Publication No. 2011/0181285, which are incorporated by reference as if fully set forth herein expressly in their entireties.

The flow chart of FIG. 1 shows an example of functionality that may be implemented in the apparatus 1010 of FIG. 1. If embodied in software or code, each block shown in FIG. 1 may represent a module, segment, or portion of code that comprises program instructions to implement the specified logical function(s). The program instructions may be embodied in the form of source code that comprises machine code that comprises numerical instructions recognizable by a suitable execution system such as the processing device 202 (FIG. 21) in a computer system or other system. The machine code may be converted from the source code, etc. If embodied in hardware, each block may represent a circuit or a number of interconnected circuits to implement the specified logical function(s).

Although the flow chart of FIG. 1 shows a specific order of execution, it is understood that the order of execution may differ from that which is depicted. For example, the order of execution of two or more blocks may be scrambled relative to the order shown. Also, two or more blocks shown in succession in FIG. 1 may be executed concurrently or with partial concurrence. Further, in some embodiments, one or more of the blocks shown in FIG. 1 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a processing device 202 in a computer system or other system. In this sense, each may comprise, for example, statements including instructions and declarations that can be fetched from the computer-readable medium and executed by the instruction execution system.

It should be emphasized that the above-described embodiments are merely examples of possible implementations. Other methods for providing motion sensitized and motion suppressed quantitative imaging described herein may be used. Many variations and modifications may be made to the above-described embodiments without departing from the principles of the present disclosure. All such modifications and variations are intended to be included herein within the scope of this disclosure and protected by the following claims.

REFERENCES

1. Morris G A, Freeman R. Selective Excitation in Fourier Transform Nuclear Magnetic Resonance. J. Magn. Reson. 1978; 29: 433-462.
2. Mosher T J, Smith M B. A DANTE Tagging Sequence for the Evaluation of Translational Sample Motion. Magn. Reson. Med. 1990; 15: 334-339.
3. Axel L, Dougherty L. Heart Wall Motion—Improved Method of Spatial Modulation of Magnetization for MR Imaging. Radiology. 1989; 172: 349-350.
4. Zur Y, Wood M L, Neuringer L J. Motion-Insensitive, Steady-State Free Precession Imaging. Magn. Reson. Med. 1990; 16(3):444-459.
5. Patz S, Hawkes R C. The Application of Steady-State Free Precession to the Study of Very Slow Fluid Flow. Magn. Reson. Med. 1986; 3: 140-145.
6. Patz S, Wong S T, Roos M S. Missing Pulse Steady-State Free Precession. Magn. Reson. Med. 1989; 10(2): 194-209.
7. Markl M, Alley M T, Elkins C J, Pelc N J. Flow Effects in Balanced Steady State Free Precession Imaging. Magn. Reson. Med. 2003; 50:892-903.
8. Markl M. Pelc. N J. On Flow Effects in Balanced Steady-State Free Precession Imaging: Pictorial Description, Parameter Dependence, and Clinical Implications. J Magn. Reson. Imag. 2004; 20:697-705.
9. Bieri O, Scheffler K. Flow Compensation in Balanced SSFP Sequences. Magn. Reson Med. 2005; 54:901-907.
10. Lin H-Y, Flask C A, Dale B M, Duerk J L. Rapid Dark-Blood Carotid Vessel-Wall Imaging with Random Biploar Gradients in a Radial SSFP Acquisition. J Magn. Reson. Imag. 2007; 25:1299-1304.
11. Patz S. Some Factors That Influence the Steady State in Steady-State Free Precession. Magn. Reson. 1988; Imaging 6: 405-413.
12. Steinman D A and Rutt B K. On the Nature and Reduction of Plaque-Mimicking Flow Artifacts in Black-Blood MRI of the Carotid Bifurcation. Magn Reson Med 1998; 39:635-641.
13. Edelman R R, Mettle H P, Waliner B, Bajakian R, Kleefield J, Kent C, Skillman J J, Mendel J B, Atkinson D J. Extracranial Carotid Arteries: Evaluation with 'Black-Blood' MR Angiography. Radiology. 1990; 177: 45-50.
14. Lin H-Y, Dale B M, Flask C A, Duerk J L. Blood Attenuation with SSFP-Compatible Saturation (BASS). J. Magn. Reson. Imag. 2006; 24:701-707.
15. Edelman R R, Chien D, Kim D. Fast Selective Black-Blood MR Imaging. Radiology. 1991; 181:655-660.
16. Sirol M, Itskovich V V, Mani V, Aguinaldo J G, Fallon J T, Misselwitz B, Weinmann H J, Fuster V, Toussaint J F, Fayad Z A. Lipid-Rich Atherosclerotic Plaques Detected by Gadofluorine-Enhanced in Vivo Magnetic Resonance imaging. Circulation. 2004; 109:2890-2896.
17. Wang J, Yarnykh V L, Hatsukami T, Chu B, Balu N, Yuan C. Improved Suppression of Plaque-Mimicking Artifacts in Black-Blood Carotid Atherosclerosis Imaging Using a Multislice Motion-Sensitized Driven-Equilibrium (MSDE) Turbo Spin-Echo (TSE) Sequence. Magn. Reson. Med. 2007; 58(5):973-81.
18. Balu N, Chu B, Hatsukami T S, Yuan C, Yarnykh V L. Comparison Between 2D and 3D High-Resolution Black-Blood Techniques for Carotid Artery Wall Imaging in Clinically Significant Atherosclerosis. J. Magn. Reson. Imaging. 2008; 27:918-924.

19. Shoup R R, Becker E D, Farrar T C. The Driven Equilibrium Fourier Transform NMR Technique: An Experimental Study. J. Magn. Reson. 1972; 8, 298-310.
20. Zur Y, Wood M L, Neuringer L J. Spoiling of Transverse Magnetization in Steady-State Sequences. Magn. Reson. Med. 1991; 21(2): 251-63.
21. Gyngell L M. The application of steady-state free precession in rapid 2DFT NMR imaging: FAST and CE-FAST sequences. Magn Reson Imag. 1988; 6:415-419.
22. Carr H. Steady-state free precession in nuclear magnetic resonance. Phys Rev. 1958; 112:1693-1701.
23. Freeman R, Hill H D W. Phase and Intensity Anomalies in Fourier Transform NMR. J. Magn. Reson. 1971; 4: 366-383.
24. Freeman R, Hill H D W. Fourier Transform Study of NMR Spin-Lattice Relaxation by "Progressive Saturation". J. Chem. Phys. 1971; 54: 3367-3377.
25. Crawley A P, Wood M L, Henkelman R M. Elimination of transverse coherences in FLASH MRI. Magn. Reson. Med. 1988; 8(3):248-260.
26. Scheffler K, Lehnhardt S. Principles and applications of balanced SSFP. Eur Radiol 2003; 13:2409-2418.
27. Hargreaves B A, Vasanawala S S, Pauly J M, Nishimura D G. Characterization and reduction of the transient response in steady-state MR imaging. Magn. Reson. Med. 2001; 46: 149-158.
28. Scheffler K. On the transient phase of balanced SSFP sequences. Magn. Reson. Med. 2003; 49: 781-783.

APPENDIX 1

To relate Eqn 7 to the steady-state Eqn 5, we use the eigenvalue decomposition of $A = V \Lambda V^T$ with diagonal matrix $\Lambda$ containing eigenvalues $\lambda_i$ [27]:

$$M_n = (V \Lambda V^T)^n M_1 + \left[ \sum_{k=0}^{n} (V \Lambda V^T)^k \right] B \qquad \text{[Eqn. A1]}$$
$$= V \Lambda^n V^T M_1 + V \Lambda_{\Sigma n} V^T B$$

Where the orthogonal eigenvector matrices V result in $V^T V = V V^T = I$, and we define:

$$\Lambda^n = \begin{vmatrix} \lambda_1^n & 0 & 0 \\ 0 & \lambda_2^n & 0 \\ 0 & 0 & \lambda_3^n \end{vmatrix} \xrightarrow{n \to \infty} 0 \qquad \text{[Eqn. A2]}$$

and:

$$\Lambda_{\Sigma n} = \begin{vmatrix} \sum_{k=0}^{n-1} \lambda_1^k & 0 & 0 \\ 0 & \sum_{k=0}^{n-1} \lambda_2^k & 0 \\ 0 & 0 & \sum_{k=0}^{n-1} \lambda_3^k \end{vmatrix} \xrightarrow{n \to \infty} \qquad \text{[Eqn. A3]}$$

$$\begin{vmatrix} (1-\lambda_1)^{-1} & 0 & 0 \\ 0 & (1-\lambda_2)^{-1} & 0 \\ 0 & 0 & (1-\lambda_3)^{-1} \end{vmatrix} = (I - \Lambda)$$

The magnetization in Eqn A1 thus consists of two components. The first component decays away from the initial magnetization $M_1$ at a rate dictated by the eigenvalues of A. Further, in the limit of $n \to \infty$:

$$M_{n \to \infty} = V(I - \Lambda)^{-1} V^T B \qquad \text{[Eqn. A4]}$$
$$= (VV^T - V \Lambda V^T)^{-1} B$$
$$= (I - A)^{-1} B = M_{ss}$$

Thus, the second component describes a relaxation toward the standard steady-state, independent of the starting magnetization. Unfortunately, the eigenvalues of A are not straightforward to derive in terms of $T_1$, $T_2$, $\alpha$, etc for arbitrary values of $\theta$ [28]. Nevertheless, these expressions can readily be used to calculate the steady-state signal behaviour for a given A and how essentially perfect agreement with Bloch simulations.

What is claimed:

1. A method for providing quantitative magnetic resonance imaging comprising:
   A. Providing a magnetic resonance imaging (MRI) device;
   B. Using the magnetic resonance image device in association with a subject to generate a train of radio frequency (RF) pulse modules in combination with field gradient pulses interlaced in between the RF pulse modules, wherein the train of RF pulse modules constitutes a non-selective unbalanced steady state precession as a moving spin suppression preparation;
   C. Repeating the train of pulses to drive static tissue in the subject into steady state in order to preserve the magnetization of the static tissue while suppressing moving spins in moving tissue or fluid in the subject; and
   D. Acquiring an image of the static tissue signal having a suppressed signal from the moving tissue and/or fluids.

2. The method of claim 1, wherein the train of pulses is regularly repeated for a period of time sufficient to drive the static tissue into a steady state.

3. The method of claim 1, wherein the train of radio frequency (RF) pulse modules comprises low flip angle RF pulses having a flip angle of about 45° or below.

4. The method of claim 1, wherein the train of radio frequency (RF) pulse modules comprises non-selective Delay Alternating with Nutation for Tailored Excitation (DANTE) pulse modules.

5. The method of claim 1, wherein the field gradient pulses are blipped magnetic field gradient pulses with gradient amplitudes varying from 0 to the maximum value provided by a scanner of the MRI device.

6. The method of claim 1, wherein the field gradient pulses are interlaced in a regular pattern between the RF pulse modules.

7. The method of claim 6, wherein the field gradient pulses are interlaced between each RF pulse module in the train.

8. The method of claim 1, wherein signal from moving spins, is simultaneously suppressed while substantially preserving the signal from static tissue signal for MR imaging readout acquisitions.

9. The method of claim 1, wherein physiological noise, influence of motion and flow artefacts are suppressed.

10. The method of claim 1, wherein the imaging is employed for an application selected from the group consisting of:

a) Flowing spin suppression in 2D or 3D Black Blood (BB) magnetic resonance imaging (MRI),
b) CSF flow quantification and suppression, allowing (e.g.) accurate multiple sclerosis evaluation or diagnosis in spinal cord (structure imaging) or physiological noise elimination in spinal cord neuroscience studies (spinal cord functional MRI),
c) digital subtraction mode allowing smaller vessels to be resolved due to superior static signal cancellation,
d) functional MRI to achieve intravascular blood suppressed blood oxygen level dependent (BOLD) signal for localization and quantification of neural activity,
e) blood suppressed MRI intervention techniques,
f) quantitative measurement of $T_1$, $T_2$ and proton density in BB images of atherosclerotic plaques in arteries of the brain or in the aorta, and
g) perfusion MRI measurement for research and clinical applications.

11. The method of claim 1, wherein the time interval between the end of one RF pulse module and the beginning of the next RF pulse module is sufficiently long to allow longitudinal magnetization to largely recover before a subsequent RF pulse module is applied.

12. The method of claim 1, wherein the number of pulses applied in the RF pulse modules ranges from 10-100, and the inter-pulse repeat time of RF pulses within the RF pulse modules is less than 5 ms.

13. A system, comprising
a magnetic resonance imaging (MRI) device;
at least one computing device;
at least one application executable in the at least one computing device, the at least one application comprising logic that:
  A. generates a train of radio frequency (RF) pulse modules in combination with field gradient pulses interlaced in between the RF pulse modules, in association with the magnetic resonance image device and a subject wherein the train of RF pulse modules constitutes a non-selective unbalanced steady state precession as a moving spin suppression preparation;
  B. repeats the train of pulses to drive static tissue in the subject into steady state in order to preserve the magnetization of the static tissue while suppressing moving spins in moving tissue or fluid in the subject; and
  C. Acquires an image of the static tissue signal having a suppressed signal from the moving tissue and/or fluids.

14. The system of claim 13, wherein the train of radio frequency (RF) pulse modules comprises low flip angle RF pulses having a flip angle of about 45° or below.

15. The system of claim 13, wherein the train of radio frequency (RF) pulse modules comprises non-selective Delay Alternating with Nutation for Tailored Excitation (DANTE) pulse modules.

16. The system of claim 13, wherein the field gradient pulses are blipped magnetic field gradient pulses with gradient amplitudes varying from 0 to the maximum value provided by a scanner of the MRI device.

17. The system of claim 13, wherein the field gradient pulses are interlaced in a regular pattern between the RF pulse modules.

18. The system of claim 17, wherein the field gradient pulses are interlaced between each RF pulse module in the train of pulses.

19. The system of claim 13, wherein signal from moving spins, is simultaneously suppressed while substantially preserving the signal from static tissue signal for MR imaging readout acquisitions.

20. The system of claim 13, wherein physiological noise, influence of motion and flow artefacts are suppressed.

* * * * *